(12) United States Patent
Yang et al.

(10) Patent No.: US 11,132,085 B2
(45) Date of Patent: Sep. 28, 2021

(54) PRESSURE-SENSING TOUCH CONTROL DISPLAY SUBSTRATE, PRESSURE-SENSING TOUCH CONTROL DISPLAY APPARATUS, METHOD OF DRIVING PRESSURE-SENSING TOUCH CONTROL DISPLAY APPARATUS, AND METHOD OF FABRICATING PRESSURE-SENSING TOUCH CONTROL DISPLAY APPARATUS

(71) Applicant: BOE Technology Group Co., Ltd., Beijing (CN)

(72) Inventors: Shengji Yang, Beijing (CN); Xue Dong, Beijing (CN); Xiaochuan Chen, Beijing (CN); Hui Wang, Beijing (CN); Pengcheng Lu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/960,049

(22) PCT Filed: Nov. 8, 2019

(86) PCT No.: PCT/CN2019/116631
§ 371 (c)(1),
(2) Date: Jul. 3, 2020

(87) PCT Pub. No.: WO2020/094127
PCT Pub. Date: May 14, 2020

(65) Prior Publication Data
US 2021/0064213 A1  Mar. 4, 2021

(30) Foreign Application Priority Data

Nov. 9, 2018  (CN) .......................... 201811332389.4

(51) Int. Cl.
| | | |
|---|---|---|
| G06F 3/041 | (2006.01) | |
| G06F 3/044 | (2006.01) | |
| G09G 3/3225 | (2016.01) | |

(52) U.S. Cl.
CPC .......... *G06F 3/04166* (2019.05); *G06F 3/044* (2013.01); *G09G 3/3225* (2013.01);
(Continued)

(58) Field of Classification Search
CPC . G06F 2203/04103; G06F 2203/04105; G06F 3/0412; G06F 3/04166;
(Continued)

(56) References Cited

U.S. PATENT DOCUMENTS

2013/0265256 A1* 10/2013 Nathan ............... G06F 3/04144
345/173
2017/0269749 A1* 9/2017 Bok ....................... G06F 3/0445
(Continued)

FOREIGN PATENT DOCUMENTS

CN      105808001 A      7/2016
CN      107092399 A      8/2017
(Continued)

OTHER PUBLICATIONS

English Translation of CN108563352 cited in IDS dated Dec. 22, 2020.*
(Continued)

*Primary Examiner* — Hong Zhou
(74) *Attorney, Agent, or Firm* — Intellectual Valley Law, P.C.

(57) ABSTRACT

A pressure-sensing touch control display substrate is provided. The pressure-sensing touch control display substrate includes a base substrate; a first electrode layer including a plurality of first electrodes; a light emitting layer on a side of the first electrode layer away from the base substrate, the
(Continued)

light emitting layer including a plurality of light emitting blocks; a second electrode layer on a side of the light emitting layer away from the first electrode layer, the second electrode layer including a plurality of second electrodes spaced apart from each other; a plurality of touch control signal lines respectively connected to the plurality of second electrodes; and a plurality of pressure sensors on the base substrate and configured to detect a pressure applied on a touch position.

18 Claims, 9 Drawing Sheets

(52) U.S. Cl.
CPC .............. *G06F 2203/04103* (2013.01); *G06F 2203/04105* (2013.01)

(58) Field of Classification Search
CPC ..... G06F 3/044; G06F 3/0443; G09G 3/3225; H01L 27/3225; H01L 27/323
See application file for complete search history.

(56) References Cited

U.S. PATENT DOCUMENTS

| | | | |
|---|---|---|---|
| 2017/0308212 A1 | 10/2017 | Jin et al. | |
| 2018/0088718 A1* | 3/2018 | Liu | G06F 3/04166 |
| 2018/0181247 A1* | 6/2018 | Yang | G06F 3/0416 |
| 2019/0042044 A1 | 2/2019 | Zhao et al. | |

FOREIGN PATENT DOCUMENTS

| | | |
|---|---|---|
| CN | 107104131 A | 8/2017 |
| CN | 107452781 A | 12/2017 |
| CN | 107704129 A | 2/2018 |
| CN | 108563352 A | 9/2018 |
| CN | 109346507 A | 2/2019 |
| WO | 2020094127 A1 | 5/2020 |

OTHER PUBLICATIONS

English Translation of CN107704129 cited in IDS dated Dec. 22, 2020.*
International Search Report & Written Opinion dated Feb. 7, 2020, regarding PCT/CN2019/116631.
First Office Action in the Chinese Patent Application No. 201811332389.4, dated Apr. 2, 2020; English translation attached.
Second Office Action in the Chinese Patent Application No. 201811332389.4, dated Sep. 15, 2020; English translation attached.

* cited by examiner

PRESSURE-SENSING TOUCH CONTROL DISPLAY SUBSTRATE, PRESSURE-SENSING TOUCH CONTROL DISPLAY APPARATUS, METHOD OF DRIVING PRESSURE-SENSING TOUCH CONTROL DISPLAY APPARATUS, AND METHOD OF FABRICATING PRESSURE-SENSING TOUCH CONTROL DISPLAY APPARATUS

CROSS-REFERENCE TO RELATED APPLICATION

This application is a national stage application under 35 U.S.C. § 371 of International Application No. PCT/CN2019/116631, filed Nov. 8, 2019, which claims priority to Chinese Patent Application No. 201811332389.4, filed Nov. 9, 2018. Each of the forgoing applications is herein incorporated by reference in its entirety for all purposes

TECHNICAL FIELD

The present invention relates to display technology, more particularly, to a pressure-sensing touch control display substrate, a pressure-sensing touch control display apparatus, a method of driving a pressure-sensing touch control display apparatus, and a method of fabricating a pressure-sensing touch control display apparatus.

BACKGROUND

In present, organic light emitting diode (OLED) display devices attract more and more attention, because OLED display devices have many advantages including self-illumination, rich colors, fast reaction speed, wide viewing angle, high contrast ratio, low power consumption, lightness and thinness, and good flexibility.

The touch control technology has become an indispensable part in a display devices. Comparing to the two-dimensional touch control technology, the three-dimensional touch control technology has a promising future. A display device using the two-dimensional touch control technology cannot detect a pressure applied on a touch position. However, a display device using the three-dimensional touch control technology can detect either a touch position or a pressure applied on the touch position.

SUMMARY

In one aspect, the present invention provides a pressure-sensing touch control display substrate, comprising a base substrate; a first electrode layer comprising a plurality of first electrodes; a light emitting layer on a side of the first electrode layer away from the base substrate, the light emitting layer comprising a plurality of light emitting blocks; a second electrode layer on a side of the light emitting layer away from the first electrode layer, the second electrode layer comprising a plurality of second electrodes spaced apart from each other; a plurality of touch control signal lines respectively connected to the plurality of second electrodes; and a plurality of pressure sensors on the base substrate and configured to detect a pressure applied on a touch position; wherein the pressure-sensing touch control display substrate is operated in a time-division driving mode; the time-division driving mode comprising a display mode and a touch control mode; a respective one of the plurality of first electrodes, a respective one of the plurality of light emitting blocks, and a respective one of the plurality of second electrodes are parts of a respective one of a plurality of light emitting elements configured to emit light for image display in the display mode; the plurality of second electrodes are parts of a plurality of touch electrodes in the touch control mode; and the plurality of touch control signal lines are configured to drive touch sensing in the plurality of touch electrodes in the touch control mode.

Optionally, a respective one of the plurality of pressure sensors comprises a first pressure-sensing electrode layer on the base substrate, and comprising a plurality of first pressure-sensing electrodes; a pressure-sensing material layer on a side of the first pressure sensing electrode layer away from the base substrate, and comprising a plurality of pressure-sensing material blocks; and a second pressure-sensing electrode layer on a side of the pressure-sensing material layer away from the first pressure sensing electrode layer, and comprising a plurality of second pressure-sensing electrodes; wherein the pressure-sensing touch control display substrate further comprises a pixel definition layer defining a plurality of subpixel apertures and defining a plurality of sensor apertures, the respective one of the plurality of light emitting blocks in a respective one of the plurality of subpixel apertures, a respective one of the plurality of pressure-sensing material blocks in a respective one of the plurality of sensor apertures.

Optionally, the pressure-sensing touch control display substrate further comprises a first spacer layer and a second spacer layer on a side of the pixel definition layer away from the base substrate; wherein the first spacer layer comprises a plurality of first spacer blocks; the second spacer layer comprises a plurality of second spacer blocks; a respective one of the plurality of first spacer blocks on a first lateral side of the respective one of the plurality of pressure-sensing material blocks; and a respective one of the plurality of second spacer blocks on a second lateral side of the respective one of the plurality of pressure-sensing material blocks; wherein the respective one of the plurality of pressure-sensing material blocks is in a receiving space defined by the pixel definition layer, the respective one of the plurality of first spacer blocks, and the respective one of the plurality of second spacer blocks; the receiving space comprises a first groove extending into the pixel definition layer and a second groove rising above the pixel definition layer, the second groove and the first groove open to each other; the second groove is defined by a pair of the respective one of the plurality of first spacer blocks, the respective one of the plurality of second spacer blocks, and a respective one of the plurality of second pressure-sensing electrodes; and the respective one of the plurality of pressure-sensing material blocks is electrically connected to respective one of the plurality of first pressure-sensing electrodes through the first groove, and is electrically connected to respective one of the plurality of second pressure-sensing electrodes through the second groove.

Optionally, the first pressure-sensing electrode layer and the first electrode layer are in a same layer and comprise a same material.

Optionally, the second pressure-sensing electrode layer and the second electrode layer are in a same layer and comprise a same material.

Optionally, an orthographic projection of a respective one of the plurality of second pressure-sensing electrodes on the base substrate substantially covers an orthographic projection of a respective one of the plurality of first pressure-sensing electrodes on the base substrate.

Optionally, the pressure-sensing touch control display substrate further comprises a plurality of insulating structures on a side of the pixel definition layer away from the base substrate; wherein a respective one of the plurality of insulating structures spaces apart two adjacent pressure sensors of the plurality of pressure sensors from each other.

Optionally, the pressure-sensing touch control display substrate further comprises a plurality of sensor thin film transistors on the base substrate; wherein a sensor gate electrode of a respective one of the plurality of sensor thin film transistors is electrically connected to the respective one of the plurality of first pressure-sensing electrodes.

Optionally, an orthographic projection of the respective one of the plurality of sensor thin film transistors on the base substrate at least partially overlaps with an orthographic projection of the respective one of the plurality of pressure sensors on the base substrate.

Optionally, the pressure-sensing touch control display substrate further comprises a plurality of pressure-sensing signal lines, a pressure-sensing circuit, and a chip, the respective one of the plurality of pressure sensors is electrically connected to the chip through the pressure-sensing circuit.

Optionally, the pressure-sensing circuit comprises a storage sub-circuit configured to store a voltage difference between a first node and a first power source; an output sub-circuit configured to, under control of the first node, amplify a signal from a second power source and output an amplified signal to a second node; and an amplification sub-circuit configured to output a second amplified signal to a signal output terminal, based on signals from a reference signal terminal and the second node; wherein the first node is connected to the respective one of the plurality of first pressure-sensing electrodes; a first terminal of the storage sub-circuit is connected to the first node; a second terminal of the storage sub-circuit is connected to the first power source; a first terminal of the output sub-circuit is connected to the second power source; a second terminal of the output sub-circuit is connected to the first node; a third terminal of the output sub-circuit is connected to the second node; a first terminal of the amplification sub-circuit is connected to the reference signal terminal; a second terminal of the amplification sub-circuit is connected to the second node; and a third terminal of the amplification sub-circuit is connected to the signal output terminal.

Optionally, the storage sub-circuit further comprises a first capacitor; a first terminal of the first capacitor is connected to the first node; a second terminal of the first capacitor is connected to the first power source; wherein the output sub-circuit comprises a first thin film transistor; a gate electrode of the first thin film transistor is connected to the first node; a source electrode of the first thin film transistor is connected to the second power source; and a drain electrode of the first thin film transistor is connected to the second node; wherein the amplification sub-circuit comprises a switch, a second capacitor, and an amplifier; a first input terminal of the amplifier is connected to the reference signal terminal; a second input terminal of the amplifier is connected to the second node; an output terminal of the amplifier is connected to the signal output terminal; a first terminal of the second capacitor is connected to the second node; and a second terminal of the second capacitor is connected to the signal output terminal.

Optionally, the pressure-sensing touch control display substrate further comprises a reset sub-circuit configured to, under control of a reset signal terminal, provide a signal from a signal input terminal to the first node; wherein a first terminal of the reset sub-circuit is connected to the reset signal terminal; a second terminal of the reset sub-circuit is connected to the signal input terminal; a third terminal of the reset sub-circuit is connected to the first node; the reset sub-circuit comprises a second thin film transistor; a gate electrode of the second thin film transistor is connected to the reset signal terminal; a source electrode of the second thin film transistor is connected to the signal input terminal; and a drain electrode of the second thin film transistor is connected to the first node.

Optionally, the pressure-sensing material layer comprises a piezoelectric material.

Optionally, an orthographic projection of the plurality of pressure sensors on the base substrate is substantially non-overlapping with orthographic projections of the first electrode layer, the light emitting layer, and the second electrode layer on the base substrate.

In another aspect, the present invention provides a pressure-sensing touch control display apparatus, comprising the pressure-sensing touch control display substrate described herein or fabricated by a method described herein, and one or more integrated circuits connected to the pressure-sensing touch control display substrate.

In another aspect, the present invention provides a method of driving a pressure-sensing touch control display apparatus, comprising operating the pressure-sensing touch control display substrate in a time-division driving mode; the time-division driving mode comprising a display mode and a touch control mode; wherein the pressure-sensing touch control display apparatus comprises a base substrate; a first electrode layer comprising a plurality of first electrodes; a light emitting layer on a side of the first electrode layer away from the base substrate, the light emitting layer comprising a plurality of light emitting blocks; a second electrode layer on a side of the light emitting layer away from the first electrode layer, the second electrode layer comprising a plurality of second electrodes spaced apart from each other; a plurality of touch control signal lines respectively connected to the plurality of second electrodes; and a plurality of pressure sensors on the base substrate and configured to detect a pressure applied on a touch position; wherein an orthographic projection of the plurality of pressure sensors on the base substrate is substantially non-overlapping with orthographic projections of the first electrode layer, the light emitting layer, and the second electrode layer on the base substrate; wherein, in the display mode, the method comprises controlling a respective one of the plurality of first electrodes, a respective one of the plurality of light emitting blocks, and a respective one of the plurality of second electrodes to form a respective one of a plurality of light emitting elements to emit light for image display; wherein, in the touch control mode, the method comprises transmitting touch signals through the plurality of touch control signal lines to drive touch sensing in the plurality of touch electrodes to detect a touch position.

Optionally, the method further comprises storing a voltage difference between a first node and a first power source in a pressure-sensing circuit; under control of the first node, amplifying a signal from a second power source and outputting an amplified signal to a second node in the pressure-sensing circuit; and outputting a second amplified signal to a signal output terminal, based on signals from a reference signal terminal and the second node.

Optionally, the method further comprises, under control of a reset signal terminal, providing a signal from a signal input terminal to the first node.

In another aspect, the present invention provides a method of fabricating a pressure-sensing touch control display apparatus, comprising forming a first electrode layer comprising a plurality of first electrodes on a base substrate; forming a light emitting layer on a side of the first electrode layer away from the base substrate, the light emitting layer comprising a plurality of light emitting blocks; forming a second electrode layer on a side of the light emitting layer away from the first electrode layer, the second electrode layer comprising a plurality of second electrodes spaced apart from each other; forming a plurality of touch control signal lines respectively connected to the plurality of second electrodes; forming a plurality of pressure sensors on the base substrate and configured to detect a pressure applied on a touch position; wherein the pressure-sensing touch control display substrate is formed to be operated in a time-division driving mode; the time-division driving mode comprising a display mode and a touch control mode; a respective one of the plurality of first electrodes, a respective one of the plurality of light emitting blocks, and a respective one of the plurality of second electrodes are parts of a respective one of a plurality of light emitting elements configured to emit light for image display in the display mode; the plurality of second electrodes are parts of a plurality of touch electrodes in the touch control mode; the plurality of touch control signal lines are configured to drive touch sensing in the plurality of touch electrodes in the touch control mode; and an orthographic projection of the plurality of pressure sensors on the base substrate is substantially non-overlapping with orthographic projections of the first electrode layer, the light emitting layer, and the second electrode layer on the base substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The three-dimensional technology is complicated. In order to adopt the three-dimensional technology, an OLED display device should be thicker to accommodate the elements enabling the three-dimensional technology, which may narrow the scope of using the OLED display device having the three-dimensional technology.

Accordingly, the present disclosure provides, inter alia, a pressure-sensing touch control display substrate, a pressure-sensing touch control display apparatus, a method of driving a pressure-sensing touch control display apparatus, and a method of fabricating a pressure-sensing touch control display apparatus that substantially obviate one or more of the problems due to limitations and disadvantages of the related art. In one aspect, the present disclosure discloses a pressure-sensing touch control display substrate. In some embodiments, the pressure-sensing touch control display substrate includes a base substrate; a first electrode layer including a plurality of first electrodes; a light emitting layer on a side of the first electrode layer away from the base substrate; a second electrode layer on a side of the light emitting layer away from the first electrode layer; a plurality of touch control signal lines respectively connected to the plurality of second electrodes; and a plurality of pressure sensors on the base substrate and configured to detect a pressure applied on a touch position. Optionally, the light emitting layer includes a plurality of light emitting blocks. Optionally, the second electrode layer includes a plurality of second electrodes spaced apart from each other. Optionally, the pressure-sensing touch control display substrate is operated in a time-division driving mode. Optionally, the time-division driving mode includes a display mode and a touch control mode. In one example, a respective one of the plurality of first electrodes, a respective one of the plurality of light emitting blocks, and a respective one of the plurality of second electrodes are parts of (e.g., constitute) a respective one of a plurality of light emitting elements configured to emit light for image display in the display mode. In another example, the plurality of second electrodes are parts of (e.g., constitute) a plurality of touch electrodes in the touch control mode. Optionally, the plurality of touch control signal lines are configured to drive touch sensing in the plurality of touch electrodes in the touch control mode.

Figure 1:
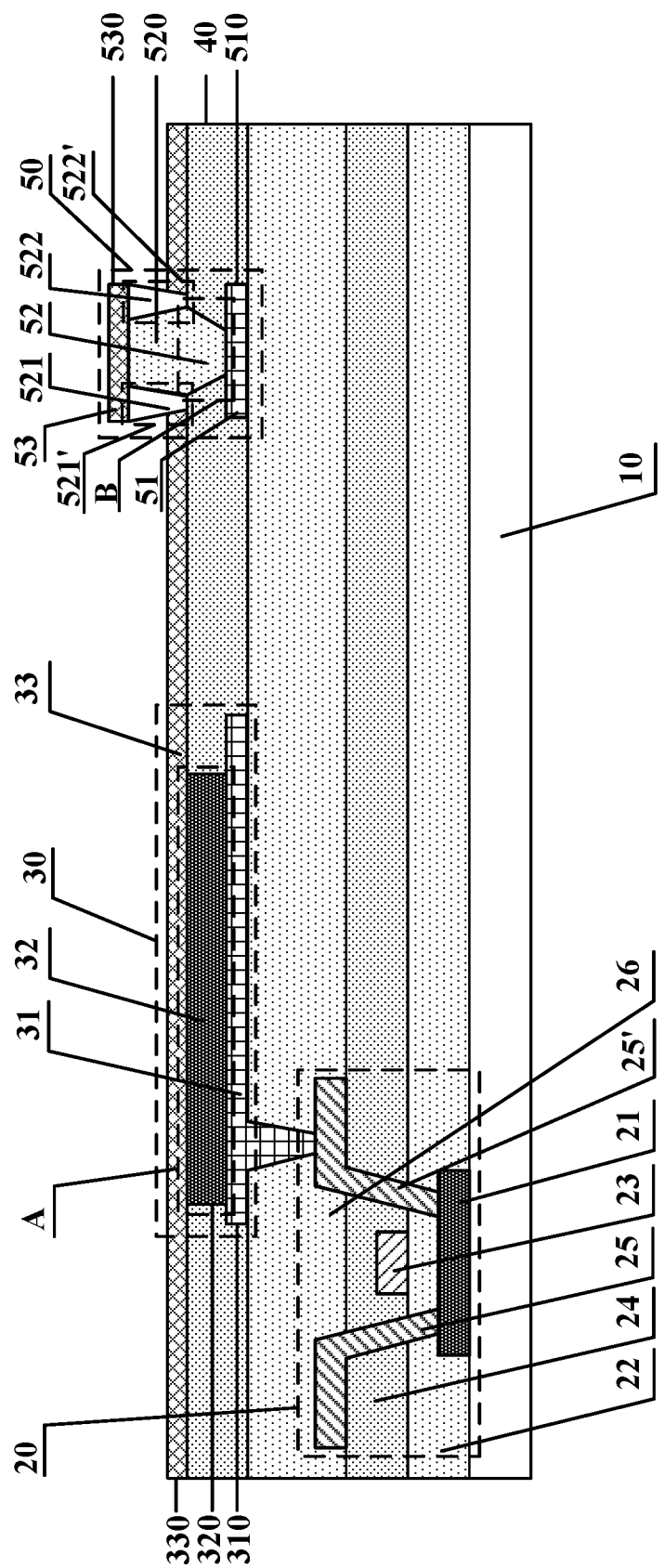
FIG. 1 is a schematic diagram illustrating a structure of a pressure-sensing touch control display substrate in some embodiments according to the present disclosure.
Figure 2:
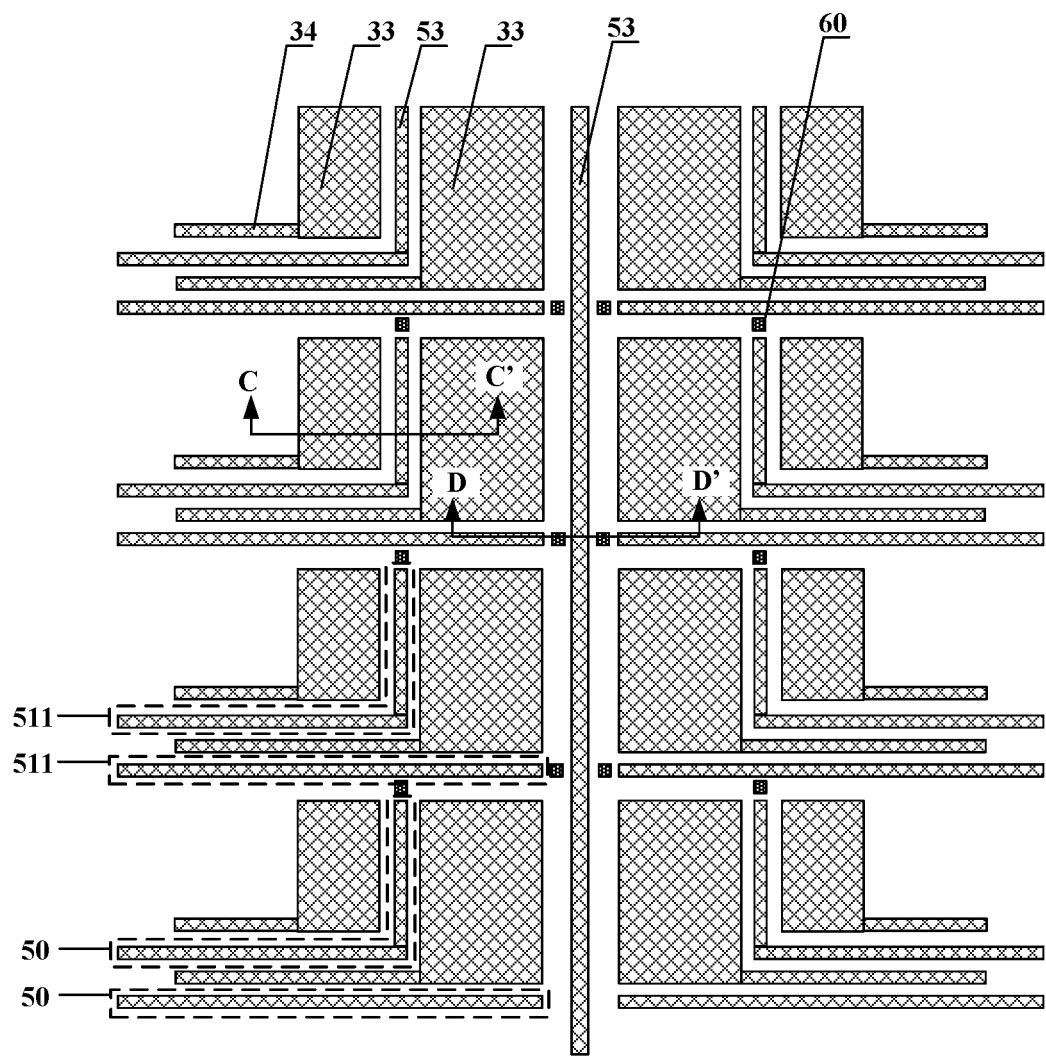
FIG. 2 is a plan view of a pressure-sensing touch control display substrate in some embodiments according to the present disclosure.

FIG. 1 is a schematic diagram illustrating a structure of a pressure-sensing touch control display substrate in some embodiments according to the present disclosure. FIG. 2 is a plan view of a pressure-sensing touch control display substrate in some embodiments according to the present disclosure. Referring to FIG. 1 and FIG. 2, FIG. 1 is a cross-sectional view of a pressure-sensing touch control display substrate in FIG. 2 along CC' direction. In some embodiments, a pressure-sensing touch control display substrate includes a base substrate 10; a first electrode layer 310 including a plurality of first electrodes 31; a light emitting layer 320 on a side of the first electrode layer 310 away from the base substrate 10, a second electrode layer 330 on a side of the light emitting layer 320 away from the first electrode layer 310. Optionally, the light emitting layer 320 includes a plurality of light emitting blocks 32. Optionally, the second electrode layer 330 includes a plurality of second electrodes 33 spaced apart from each other. Optionally, a plurality of touch control signal lines 34 in FIG. 2 are respectively connected to the plurality of second electrodes 33. Optionally, a plurality of pressure sensors 50 are on the base substrate 10 and configured to detect a pressure applied on a touch position.

In some embodiments, the pressure-sensing touch control display substrate is operated in a time-division driving mode. Optionally, the time-division driving mode includes a display mode and a touch control mode. In the display mode, a respective one of the plurality of first electrodes 31, a respective one of the plurality of light emitting blocks 32, and a respective one of the plurality of second electrodes 33 are parts of a respective one of a plurality of light emitting elements 30 configured to emit light for image display. In the touch control mode, the plurality of second electrodes 33 are parts of a plurality of touch electrodes. For example, the plurality of second electrodes 33 are configured to detect a touch position. The plurality of touch control signal lines 34 are configured to drive touch sensing in the plurality of touch electrodes (e.g. the plurality of second electrodes 33) in the touch control mode.

In some embodiments, the plurality of touch control signal lines 34 are connected to a touch control circuit. Optionally, the plurality of second electrodes 33 in the touch control mode are a plurality of self-capacitive touch electrodes, and a respective one of the plurality of second electrodes 33 is configured to independently receive a touch scanning signal from the touch control circuit through a respective one of the plurality of touch control signal lines 34. For example, in the touch control mode, when a finger touches a position on the pressure-sensing touch control display panel, a capacitor of the finger superimposes on a touch electrode capacitor, resulting in a change in the capacitance of the touch electrode capacitor. The touch control circuit detects the change in the capacitance of the touch electrode capacitor through a respective one of the plurality of touch control signal lines 34. The touch control circuit detects the touch position based on the change in the capacitance of the touch electrode capacitor. Optionally, the plurality of second electrodes 33 in the touch control mode are a plurality of mutual-capacitive touch electrodes, and the plurality of touch control signal lines 34 includes a plurality of touch scanning signal lines and a plurality of touch sensing signal lines.

In the display mode, a respective one of the plurality of second electrodes 33 is configured to independently receive a common voltage signal, e.g., through a respective one of the plurality of touch control signal lines 34. In the display mode, the plurality of touch control signal lines 34 function as a plurality of common electrode signal lines for transmitting a common voltage.

In some embodiments, an orthographic projection of the plurality of pressure sensors 50 on the base substrate 10 is substantially non-overlapping with orthographic projections of the first electrode layer 310, the light emitting layer 320, and the second electrode layer 330 on the base substrate 10. Optionally, the orthographic projection of the plurality of pressure sensors 50 on the base substrate 10 is substantially non-overlapping with orthographic projections of the plurality of light emitting elements 30. For example, the orthographic projection of the plurality of pressure sensors 50 on the base substrate 10 is 100 percent non-overlapping with orthographic projections of the plurality of light emitting elements 30.

As used herein, the term "substantially non-overlapping" refers to two orthographic projections being at least 50 percent (e.g., at least 60 percent, at least 70 percent, at least 80 percent, at least 90 percent, at least 95 percent, at least 99 percent, and 100 percent) non-overlapping.

In some embodiments, the pressure-sensing touch control display substrate further includes a plurality of thin film transistors 20 on the base substrate 10. Optionally, the respective one of the plurality of thin film transistors 20 has a top gate structure. Optionally, the respective one of the plurality of thin film transistors 20 has a bottom gate structure. For example, referring to FIG. 1, the respective one of the plurality of thin film transistors 20 includes an active layer 21, a gate insulating layer 22, a gate electrode 23, an inter-layer dielectric layer 24, a source electrode 25, a drain electrode 25', a planarization layer 26.

Various types of thin film transistors may be used as the respective one of the plurality of thin film transistors. Examples of types of thin film transistors include, but are not limited to amorphous silicon thin film transistors, low temperature polysilicon thin film transistors, oxide thin film transistors, and organic thin film transistors.

Various appropriate materials may be used for making the base substrate 10. Examples of materials suitable for making the base substrate include, but are not limited to, rigid substrates and flexible substrates. Optionally, the rigid substrates include, but are not limited to glass substrates, metal substrates. Optionally, the flexible substrates include, but are not limited to substrates made of one or more materials selected from a group consisting of polyethylene terephthalate, ethylene terephthalate, polyetheretherketone, polystyrene, polycarbonate, polyarylate, polyarylate, polyimide, polyvinyl chloride, polyethylene, and textile fiber.

In some embodiments, a respective of the plurality of first electrodes 31 is an anode of the respective one of the plurality of light emitting elements 30. In some embodiments, a respective one of the plurality of second electrodes 33 is a cathode of the respective one of the plurality of light emitting elements 30.

Various appropriate electrode materials may be used for making the respective one of the plurality of first electrodes 31 and the respective one of the plurality of second electrodes 33. Examples of materials suitable for making the respective one of the plurality of first electrodes 31 and the respective one of the plurality of second electrodes 33 include, but are not limited to, materials having good electrical conductivity, stability, and high work functions, metal materials having low work functions and alloy materials having low work functions. Optionally, in order to overcome a problem that metallic calcium, potassium, and lithium have high chemical activities, the respective one of the plurality of first electrodes 31 or the respective one of the plurality of second electrodes 33 can be made of alloy materials combining metal materials having low work functions and corrosion resistant metal materials. For example, the corrosion resistant metal materials include, but are not limited to, magnesium silver, and lithium aluminide. Especially when the thickness of the respective one of the plurality of first electrodes 31 or the respective one of the plurality of second electrodes 33 is in a range of 1 μm to 2 μm, the suitable electrode materials include, but are not limited to metal materials having low work functions and alloy materials having low work functions.

Optionally, the respective one of the plurality of first electrodes 31 is an anode. The respective one of the plurality of second electrodes 33 is a cathode. Optionally, the respective one of the plurality of first electrodes 31 is a cathode. The respective one of the plurality of second electrodes 33 is an anode.

Optionally, the respective one of the plurality of first electrodes 31 is substantially transparent. The respective one of the plurality of second electrodes 33 is substantially non-transparent. Optionally, the respective one of the plurality of second electrodes 33 is substantially transparent. The respective one of the plurality of first electrodes 31 is substantially non-transparent.

As used herein, the term "substantially transparent" means at least 50 percent (e.g., at least 60 percent, at least 70 percent, at least 80 percent, at least 90 percent, and at least 95 percent) of an incident light in the visible wavelength range transmitted therethrough.

As used herein, the term "substantially non-transparent" means at least 50 percent (e.g., at least 60 percent, at least 70 percent, at least 80 percent, at least 90 percent, and at least 95 percent) of an incident light in the visible wavelength range not transmitted therethrough.

In some embodiments, referring to FIG. 2, the plurality of second electrodes 33 are arranged in array. Optionally, the plurality of second electrodes 33 have a same shape. In the display mode, the plurality of second electrodes 33 are configured to control light emitted from the plurality of light emitting elements 30. In the touch control mode, the plurality of second electrodes 33 are the plurality of touch electrodes configured to detect the touch position.

Optionally, the plurality of second electrodes 33 are respectively connected to the plurality of touch control signal lines 34. Optionally, a portion of the edge of a respective one of the plurality of second electrodes 33 are connected to the respective one of the plurality of touch control signal lines 34.

Optionally, the plurality of second electrodes 33 are self-capacity touch electrodes.

A respective one of the plurality of light emitting blocks 32 includes a hole injection layer, a hole transport layer, an organic light emitting layer, an electron transport layer, and an electron injection layer sequentially stacked together.

In some embodiments, referring to FIG. 1, the pressure-sensing touch control display substrate further includes a pixel definition layer 40 defining a plurality of subpixel apertures A and defining a plurality of sensor apertures B.

Optionally, the pixel definition layer 40 is configured to space apart two adjacent light emitting elements of the plurality of light emitting elements 30. Optionally, the pixel definition layer 40 is configured to space apart two adjacent subpixel regions of the pressure-sensing touch control display substrate. Optionally, the plurality of pressure sensors 50 are disposed in the display area of the pressure-sensing touch control display substrate. For example, the plurality of pressure sensors 50 are disposed in an inter-subpixel region. The plurality of pressure sensors 50 are integrated in the pressure-sensing touch control display substrate, which reduces the size of the pressure-sensing touch control display substrate.

As used herein, the term "display area" refers to an area of the pressure-sensing touch control display substrate where image is actually displayed. Optionally, the display area may include both a subpixel region and an inter-subpixel region. A "subpixel region" refers to a light emission region of a subpixel, such as a region corresponding to a pixel electrode in a liquid crystal display or a region corresponding to a light emissive layer in an organic light emitting display. An "inter-subpixel region" refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels.

Optionally, a thickness of the pixel definition layer 40 is in a range of 1.5 μm to 3 μm, e.g. 1.5 μm to 2 μm, 2 μm to 2.5 μm, 2.5 μm to 3 μm.

Various materials may be used for making the pixel definition layer 40. Examples of materials suitable for making the pixel definition layer 40 include, but are not limited to organic materials and photoresist materials. Optionally, the organic materials include, but are not limited to polyimide, polytetrafluoroethylene, and resin. Optionally, the photoresist materials include, but are not limited to polyvinyl alcohol, and laurate.

In some embodiments, a respective one of the plurality of pressure sensors 50 includes a first pressure-sensing electrode layer 510 on the base substrate 10, a pressure-sensing material layer 520 on a side of the first pressure-sensing electrode layer 510 away from the base substrate 10; and a second pressure-sensing electrode layer 530 on a side of the pressure-sensing material layer 520 away from the first pressure-sensing electrode layer 510. Optionally, the first pressure-sensing electrode layer 510 includes a plurality of first pressure-sensing electrodes 51. Optionally, the pressure-sensing material layer 520 includes a plurality of pressure-sensing material blocks 52. Optionally, the second pressure-sensing electrode layer 530 includes a plurality of second pressure-sensing electrodes 53.

Optionally, the respective one of the plurality of light emitting blocks 32 is in a respective one of the plurality of subpixel apertures A, a respective one of the plurality of pressure-sensing material blocks 52 is in a respective one of the plurality of sensor apertures B.

Optionally, the orthographic projection of the plurality of pressure sensors 50 on the base substrate 10 is substantially non-overlapping with orthographic projections of the plurality of light emitting elements 30. For example, the orthographic projection of the plurality of pressure sensors 50 on the base substrate 10 is 100 percent non-overlapping with orthographic projections of the plurality of light emitting elements 30.

Optionally, the first pressure-sensing electrode layer 510 and the first electrode layer 310 are in a same layer and include a same material. For example, the plurality of first pressure-sensing electrodes 51 and the plurality of plurality of first electrodes 31 are in a same layer and include a same material.

As used herein, the term "same layer" refers to the relationship between the layers simultaneously formed in the same step. In one example, the first pressure-sensing electrode layer 510 and the first electrode layer 310 are in a same layer when they are formed as a result of one or more steps of a same patterning process performed in a same layer of material. In another example, the first pressure-sensing electrode layer 510 and the first electrode layer 310 can be formed in a same layer by simultaneously performing the step of forming the first pressure-sensing electrode layer 510 and the step of forming the first electrode layer 310. The term "same layer" does not always mean that the thickness of the layer or the height of the layer in a cross-sectional view is the same.

Optionally, the plurality of first pressure-sensing electrodes 51 and the plurality of plurality of first electrodes 31 are in a same layer when they are formed as a result of one or more steps of a same patterning process performed in a same layer of material. In another example, the plurality of first pressure-sensing electrodes 51 and the plurality of plurality of first electrodes 31 can be formed in a same layer by simultaneously performing the step of forming the plurality of first pressure-sensing electrodes 51 and the step of forming the plurality of plurality of first electrodes 31. The term "same layer" does not always mean that the thickness of the layer or the height of the layer in a cross-sectional view is the same.

Optionally, the pressure-sensing material layer 520 is on the side of the first pressure-sensing electrode layer 510 away from the base substrate 10. For example, the plurality of pressure-sensing material blocks 52 is respective on the side of the plurality of first pressure-sensing electrodes 51 away from the base substrate 10.

Optionally, the light emitting layer 320 is on the side of the first electrode layer 310 away from the base substrate 10. For example, the plurality of light emitting blocks 32 is respectively on the side of the plurality of first electrodes 31 away from the base substrate 10.

Referring to FIG. 1 and FIG. 2, optionally, the plurality of second electrodes 33 are insulated with each other. For example, two adjacent second electrodes of the plurality of second electrodes 33 are spaced apart by one of the plurality of pressure sensors 50.

Optionally, the plurality of pressure sensors 50 are configured to detect a level of pressure of the touch position.

In some embodiments, the plurality of light emitting elements 30 can detect a touch position in the touch control mode, the plurality of pressure sensors 50 can detect the pressure applied on the touch position. The pressure-sensing touch control display substrate having the plurality of light emitting elements 30 and the plurality of pressure sensors 50 can perform a three-dimensional touch control, which may greatly enhance the added value of the product.

In some embodiments, the plurality of second electrodes 33 and the plurality of pressure sensors 50 are integrated in the pressure-sensing touch control display substrate. Optionally, the orthographic projection of the plurality of second electrodes 33 on the base substrate 10 is substantially non-overlapping with the orthographic projection of the plurality of pressure sensors 50. As compared to the conventional display substrate, the present display substrate can be made with a much simplified fabricating process, with a reduced thickness of the display panel.

In some embodiments, referring to FIG. 1, the respective one of the plurality of pressure sensors 50 includes the first pressure-sensing electrode layer 510 on the base substrate 10, the pressure-sensing material layer 520 on the side of the first pressure-sensing electrode layer 510 away from the base substrate and the second pressure-sensing electrode layer 530 on the side of the pressure-sensing material layer 520 away from the first pressure-sensing electrode layer 510. Optionally, the first pressure-sensing electrode layer 510 includes the plurality of first pressure-sensing electrodes 51. Optionally, the pressure-sensing material layer 520 includes the plurality of pressure-sensing material blocks 52. Optionally, the second pressure-sensing electrode layer 530 includes the plurality of second pressure-sensing electrodes 53.

Optionally, the pressure-sensing material layer 520 is between the first pressure-sensing electrode layer 510 and the second pressure-sensing electrode layer 530. Optionally, the respective one of the plurality of pressure-sensing material blocks 52 is between the respective one of the plurality of first pressure-sensing electrodes 51 and the respective one of the plurality of second pressure-sensing electrodes 53. Optionally, the first pressure-sensing electrode layer 510 is on a side of the pressure-sensing material layer 520 closer to the base substrate 10. Optionally, the respective one of the plurality of first pressure-sensing electrodes 51 is on a side of the respective one of the plurality of pressure-sensing material blocks 52 closer to the base substrate 10.

Optionally, the first pressure-sensing electrode layer 510 and the first electrode layer 310 are in a same layer. Optionally, the first pressure-sensing electrode layer 510 and the first electrode layer 310 include a same material. Optionally, the first pressure-sensing electrode layer 510 and the first electrode layer 310 are formed as a result of one or more steps of a same patterning process performed in a same layer of material. Optionally, the first pressure-sensing electrode layer 510 and the first electrode layer 310 are formed in a same layer by simultaneously performing the step of forming the first pressure-sensing electrode layer 510 and the step of forming the first electrode layer 310.

Optionally, the plurality of first pressure-sensing electrodes 51 and the plurality of first electrodes 31 are in a same layer. Optionally, the plurality of first pressure-sensing electrodes 51 and the plurality of first electrodes 31 include a same material. Optionally, the plurality of first pressure-sensing electrodes 51 and the plurality of first electrodes 31 are formed as a result of one or more steps of a same patterning process performed in a same layer of material. Optionally, the plurality of first pressure-sensing electrodes 51 the plurality of first electrodes 31 are formed in a same layer by simultaneously performing the step of forming the plurality of first pressure-sensing electrodes 51 and the step of forming the plurality of first electrodes 31.

Figure 3:
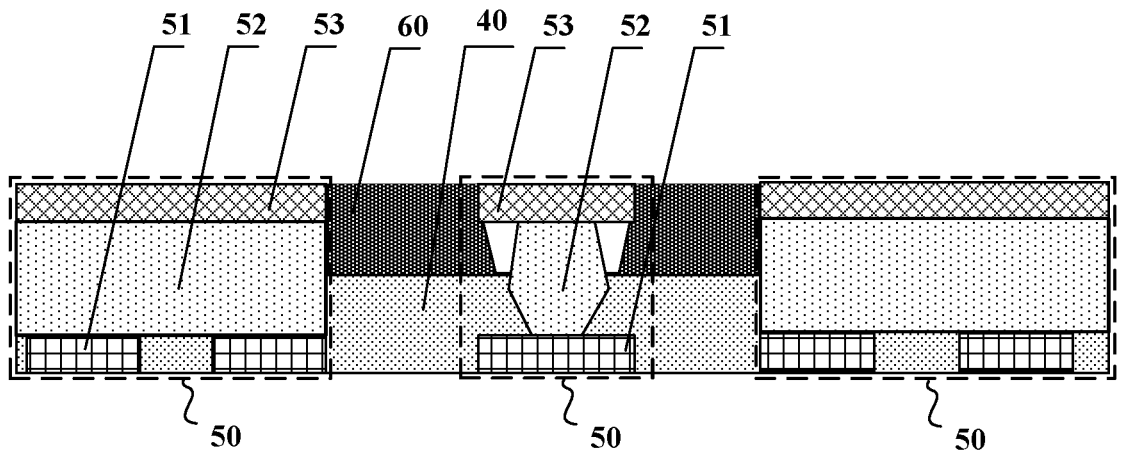
FIG. 3 is a schematic diagram illustrating a structure of a respective one of the plurality of pressure sensors in some embodiments according to the present disclosure.

FIG. 3 is a schematic diagram illustrating a structure of a respective one of the plurality of pressure sensors in some embodiments according to the present disclosure. FIG. 3 is a cross-sectional view of one of the plurality of pressure sensors along DD' direction in FIG. 2. Referring to FIG. 1, FIG. 2, and FIG. 3, in some embodiments, the plurality of first pressure-sensing electrodes 51 are parts of a plurality of rows of first pressure-sensing electrodes 511. In one example, the plurality of rows of first pressure-sensing electrodes 511 are along a row direction. In another example, the plurality of rows of first pressure-sensing electrodes 511 are along a column direction. In another example, at least one of the plurality of rows of first pressure-sensing electrodes 511 has a folded strip shape.

Optionally, the number of the plurality of first pressure-sensing electrodes 51 constituting a respective one row of the plurality of rows of first pressure-sensing electrodes 511 is more than one. For example, FIG. 3 shows six first pressure-sensing electrodes constitute one row of the plurality of rows of first pressure-sensing electrodes 551.

Various appropriate materials may be used for making the plurality of first pressure-sensing electrodes 51. Examples of materials suitable for making the plurality of first pressure-sensing electrodes 51 include, but are not limited to, conductive materials having high conductivity. For example, the conductive materials having high conductivity include, but are not limited to, silver or aluminum.

In order to simply the fabricating process, optionally, the plurality of first pressure-sensing electrodes 51 and the plurality of first electrodes 31 are in a same layer and include a same material.

Figure 4:
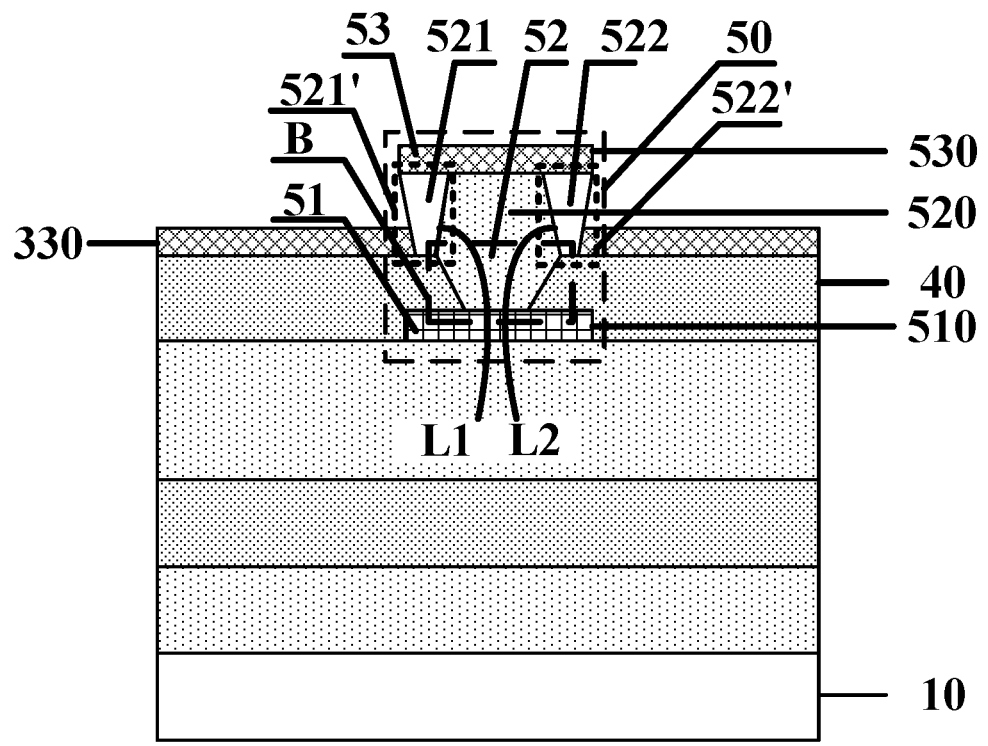
FIG. 4 is a schematic diagram illustrating a structure of a respective one of the plurality of pressure sensors in some embodiments according to the present disclosure.

FIG. 4 is a schematic diagram illustrating a structure of a respective one of the plurality of pressure sensors in some embodiments according to the present disclosure. FIG. 4 is a partial cross-sectional view of one of the plurality of pressure sensors along CC' direction in FIG. 2. In some embodiments, referring to FIG. 2 and FIG. 4, the pressure-sensing touch control display substrate includes a first spacer layer 521 and a second spacer layer 522 on a side of the pixel definition layer 40 away from the base substrate 10. Optionally, the first spacer layer 521 includes a plurality of first spacer blocks 521'. Optionally, the second spacer layer 522 includes a plurality of second spacer blocks 522'. Optionally, a respective one of the plurality of first spacer blocks 521' is on a first lateral side L1 of the respective one of the plurality of pressure-sensing material blocks 52. Optionally, a respective one of the plurality of second spacer blocks 522' is on a second lateral side L2 of the respective one of the plurality of pressure-sensing material blocks 52.

As used herein, the term "lateral side" is used in its ordinary sense and refers without limitation to, for example, an outer peripheral wall surface rising on the sides from a bottom surface.

In some embodiments, the pixel definition layer 40 defines the plurality of sensor apertures B. Optionally, a respective one of the plurality of pressure-sensing material blocks 52 is in a respective one of the plurality of sensor apertures B.

Optionally, the respective one of the plurality of first spacer blocks 521' and the respective one of the plurality of second spacer blocks 522' are on the side of the pixel definition layer 40 away from the base substrate 10. Optionally, the respective one of the plurality of first spacer blocks 521' is on the first lateral side L1 of the respective one of the plurality of pressure-sensing material blocks 52. The respective one of the plurality of second spacer blocks 522' is on the second lateral side L2 of the respective one of the plurality of pressure-sensing material blocks 52. Optionally, the respective one of the plurality of pressure-sensing material blocks 52 is between the respective one of the plurality of first spacer blocks 521' and the respective one of the plurality of second spacer blocks 522'.

Optionally, the respective one of the plurality of pressure-sensing material blocks 52 is in direct contact with the respective one of the plurality of first pressure-sensing electrodes 51.

In some embodiments, the first spacer layer 521 and the second spacer layer 522 are between the display substrate described herein and a counter substrate facing the display substrate. Optionally, the first spacer layer 521 and the second spacer layer 522 maintain a distance between the second pressure electrode layer 530 and the first pressure-sensing electrode layer 510. Optionally, the first spacer layer 521 and the second spacer layer 522 maintain a distance between the second pressure electrode layer 530 and the pixel definition layer 40.

In one example, the second pressure-sensing electrode layer 530 is between the first spacer layer 521 and the counter substrate. In another example, the second pressure-sensing electrode layer 530 is between the second spacer layer 522 and the counter substrate.

Optionally, a normal height of the first spacer layer 521 is greater than the normal height of the second electrode layer 330. And a normal height of the second spacer layer 522 is greater than the normal height of the second electrode layer 330. Optionally, a normal height of the pressure-sensing material layer 520 is greater than a normal height of the second electrode layer 330.

In some embodiments, referring to FIG. 1, the respective one of the plurality of first spacer blocks 521' and the respective one of the plurality of second spacer blocks 522' space apart the respective one of the plurality of second electrodes 33 and the respective one of the plurality of second pressure-sensing electrodes 53.

In some embodiments, the second pressure-sensing electrode layer 530 and the second electrode layer 330 are in a same layer and includes a same material. For example, the second pressure-sensing electrode layer 530 and the second electrode layer 330 are formed in a same open masking process. Because the normal height of the first spacer layer 521 and the normal height of the second spacer layer 522 are greater than the normal height of the second electrode layer 330, the second pressure-sensing electrode layer 530 formed on a side of the first spacer layer 521 away from the pixel definition layer 40 is separated from the second electrode layer 330 on a side of the pixel definition layer 40 away from the base substrate 10 at the edge of the first spacer layer 521, and the second pressure-sensing electrode layer 530 formed on a side of the second spacer layer 522 away from the pixel definition layer 40 is separated from the second electrode layer 330 on the side of the pixel definition layer 40 away from the base substrate 10 at the edge of the second spacer layer 522.

Using a same process to form second pressure-sensing electrode layer 530 and the second electrode layer 330 can simply the process of fabricating the pressure-sensing touch control display substrate and lower the cost of fabricating the pressure-sensing touch control display substrate Various appropriate materials may be used for making the pressure-sensing material layer 520. Examples of materials suitable for making the pressure-sensing material layer 520 include, but are not limited to, piezoelectric materials. Optionally, the piezoelectric materials include, but are not limited to, natural piezoelectric substrates, piezoelectric ceramics, and polymer-film piezoelectrics. Optionally, the natural piezoelectric substrates include, but are not limited to, quartz single crystals. Optionally, the piezoelectric ceramics include, but are not limited to, lithium niobate, gallium arsenide, zinc oxide, aluminium nitride and lead zirconate-titanate (PZT). Optionally, the polymer-film piezoelectrics include, but are not limited to, polyvinylidene fluoride (PVDF). Additional examples of appropriate piezoelectric materials further include lead zirconium titanate, berlinite, barium titanate, lead titanate, and various substitutes and derivatives thereof (e.g., doped with one or more dopant).

Various appropriate materials may be used for making the first spacer layer 521 and the second spacer layer 522.

Examples of materials suitable for making the first spacer layer 521 and the second spacer layer 522 include, but are not limited to, insulating materials. Optionally, the insulating materials include a photoresist material, for example, the insulating materials include a negative photoresist material. Optionally, the insulating materials include, but are not limited to, a resin, $SiO_x$ and $SiN_x$.

Various appropriate materials may be used form making the second pressure-sensing electrode layer 530. Examples of materials suitable for making the second pressure-sensing electrode layer 530 include, but are not limited to, conductive materials having high conductivity. Optionally, the conductive materials having high conductivity include, but are not limited to, a metal, an alloy, a transparent conductive material such as indium tin oxide and nano-silver. In one example, the second pressure-sensing electrode layer 530 is made of silver. In another example, the second pressure-sensing electrode layer 530 is made of aluminum.

In some embodiments, an orthographic projection of a respective one of the plurality of second pressure-sensing electrodes 53 on the base substrate 10 substantially covers an orthographic projection of a respective one of the plurality of first pressure-sensing electrodes 51 on the base substrate 10.

As used herein, the term "substantially covers" refers to one orthographic projection being at least 50%, at least 60%, at least 70%, at least 80%, at least 90%, at least 95%, at least 99%, or 100% covered by another orthographic projection.

Referring to FIG. 1, FIG. 2 and FIG. 3, in some embodiments, the pressure-sensing touch control display substrate further includes a plurality of insulating structures 60 on a side of the pixel definition layer 40 away from the base substrate 10. Optionally, a respective one of the plurality of insulating structures 60 spaces apart two adjacent pressure sensors of the plurality of pressure sensors 50 from each other. Optionally, the respective one of the plurality of insulating structures 60 spaces apart two adjacent second pressure-sensing electrodes of the plurality of second pressure-sensing electrodes 53, which may avoid short circuits formed between two adjacent second pressure-sensing electrodes of the plurality of second pressure-sensing electrodes 53.

Various appropriate materials may be used for making the plurality of insulating structures 60. Examples of materials suitable for making the plurality of insulating structures 60 include, but are not limited to, insulating materials such as poly(sodium-p-styrenesulfonate) (PSS).

Figure 5:
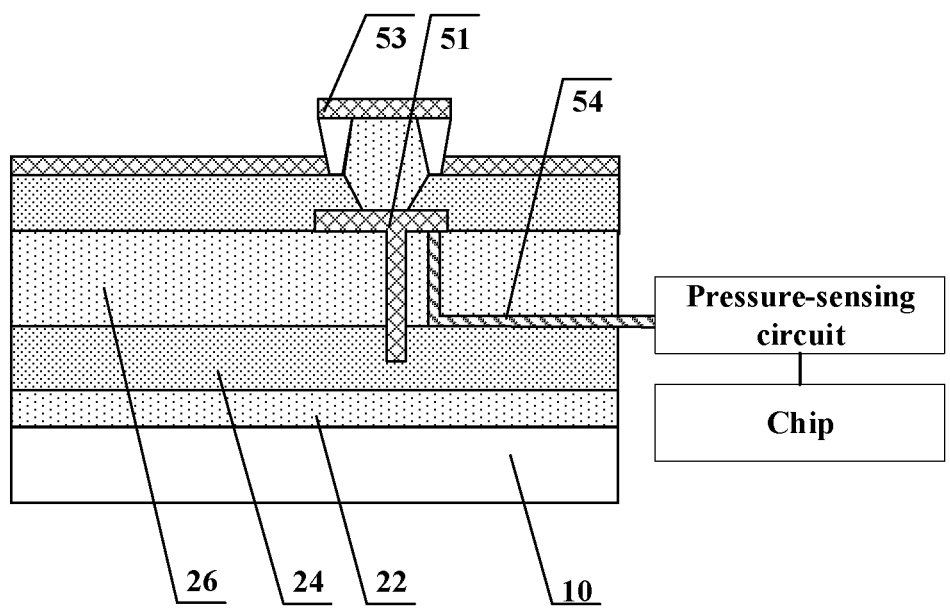
FIG. 5 is a schematic diagram illustrating a structure of a pressure-sensing touch control display substrate in some embodiments according to the present disclosure.

FIG. 5 is a schematic diagram illustrating a structure of a pressure-sensing touch control display substrate in some embodiments according to the present disclosure. Referring to FIG. 5, in some embodiments, the pressure-sensing touch control display substrate further includes a plurality of pressure-sensing signal lines 54, a pressure-sensing circuit, and a chip. Optionally, the respective one of the plurality of pressure sensors 50 is electrically connected to the chip through the pressure-sensing circuit. Optionally, the respective one of the plurality of first pressure-sensing electrodes 51 is electrically connected to the pressure-sensing circuit through a respective one of the plurality of pressure-sensing signal lines 54. Optionally, a signal output terminal of the pressure-sensing circuit is electrically connected to the chip.

In some embodiments, the chip is electrically connected to the plurality of second electrodes through the touch control circuit. Optionally, the respective one of the plurality of second electrodes is electrically connected to the touch control circuit through a respective one of the plurality of touch control signal lines. By electrically connecting the plurality of second electrodes with the chip, the chip can detect a touch position based on the changes of electric potential of the plurality of second electrodes.

In some embodiments, referring to FIG. 1 and FIG. 5, the chip is electrically connected to the plurality of pressure sensors 50. In order to detect pressure of a touch on the pressure-sensing touch control display substrate, a voltage difference between the respective one of the plurality of first pressure-sensing electrodes 51 and the respective one of the plurality of second pressure-sensing electrodes 53 is maintained, and a capacitance between the respective one of the plurality of first pressure-sensing electrodes 51 and the respective one of the plurality of second pressure-sensing electrodes 53 is also maintained.

Optionally, the respective one of the plurality of second pressure-sensing electrodes 53 is a reference electrode. In one example, a fixed electric potential is applied on the respective one of the plurality of second pressure-sensing electrodes 53. In another example, the respective one of the plurality of second pressure-sensing electrodes 53 is connected to the ground.

Optionally, the respective one of the plurality of first pressure-sensing electrodes 51 is a pressure-sensing electrode. The respective one of the plurality of first pressure-sensing electrodes 51 is connected to the pressure-sensing circuit through the respective one of the plurality of pressure-sensing signal lines 54.

In one example, no touch is applied on the pressure-sensing touch control display substrate, the respective one of the plurality of second pressure-sensing electrodes 53 has the fixed electric potential. The respective one of the plurality of first pressure-sensing electrodes 51 is at an initial electric potential. An initial capacitance is maintained between the respective one of the plurality of first pressure-sensing electrodes 51 and the respective one of the plurality of second pressure-sensing electrodes 53.

In another example, a touch is applied on the pressure-sensing touch control display substrate, a distance between the respective one of the plurality of first pressure-sensing electrodes 51 and the respective one of the plurality of second pressure-sensing electrodes 53 is changed, resulting in a deviation of a center of positive charges and negative charges. The deviation of the center of positive charges and negative charges leads to polarization, so charges appear on a surface of the respective one of the plurality of first pressure-sensing electrodes 51. By detecting the charges on the surface of the respective one of the plurality of first pressure-sensing electrodes 51, the chip can detect the level of the pressure, and perform pressure-sensing function.

Figure 6A:
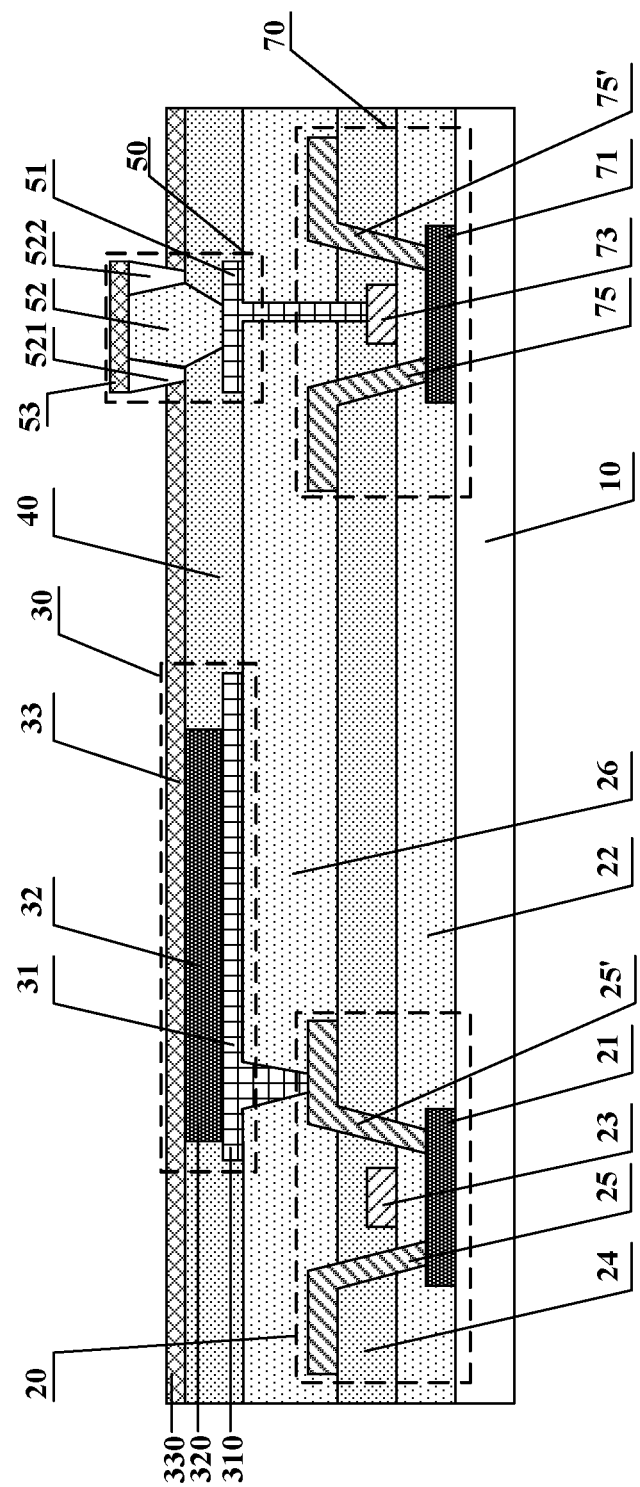
FIG. 6A is a schematic diagram illustrating a structure of a pressure-sensing touch control display substrate in some embodiments according to the present disclosure.

FIG. 6A is a schematic diagram illustrating a structure of a pressure-sensing touch control display substrate in some embodiments according to the present disclosure. Referring to FIG. 6A, in some embodiments, the pressure-sensing touch control display substrate further includes a plurality of sensor thin film transistors 70 on the base substrate 10. Optionally, a sensor gate electrode 73 of a respective one of the plurality of sensor thin film transistors 70 is electrically connected to the respective one of the plurality of first pressure-sensing electrodes 51.

Optionally, an orthographic projection of the respective one of the plurality of sensor thin film transistors 70 on the base substrate 10 at least partially overlaps with an orthographic projection of the respective one of the plurality of pressure sensors 50 on the base substrate 10.

As used herein, the term "partially overlap" refers to two orthographic projections at least 10%, e.g., at least 20%, at least 40%, at least 60%, at least 80%, at least 90%, at least 95%, overlapping with each other.

Optionally, the plurality of thin film transistors 20 and the plurality of sensor thin film transistors 70 are formed using a same process.

Optionally, the respective one of the plurality of sensor thin film transistors 70 includes a sensor active layer 71, a sensor source electrode 75, a sensor drain electrode 75'. Optionally, the plurality of thin film transistors 20 and the plurality of sensor thin film transistors 70 share the same insulating layer 22, the same inter-layer dielectric layer 24, and the same planarization layer 26.

By connecting the sensor gate electrode 73 of the respective one of the plurality of sensor thin film transistors 70 to the respective one of the first pressure-sensing electrodes 51 of the respective one of the plurality of pressure sensors 50, the respective one of the plurality of pressure sensors 50 can control the respective one of the plurality of sensor thin film transistors 70.

Figure 6B:
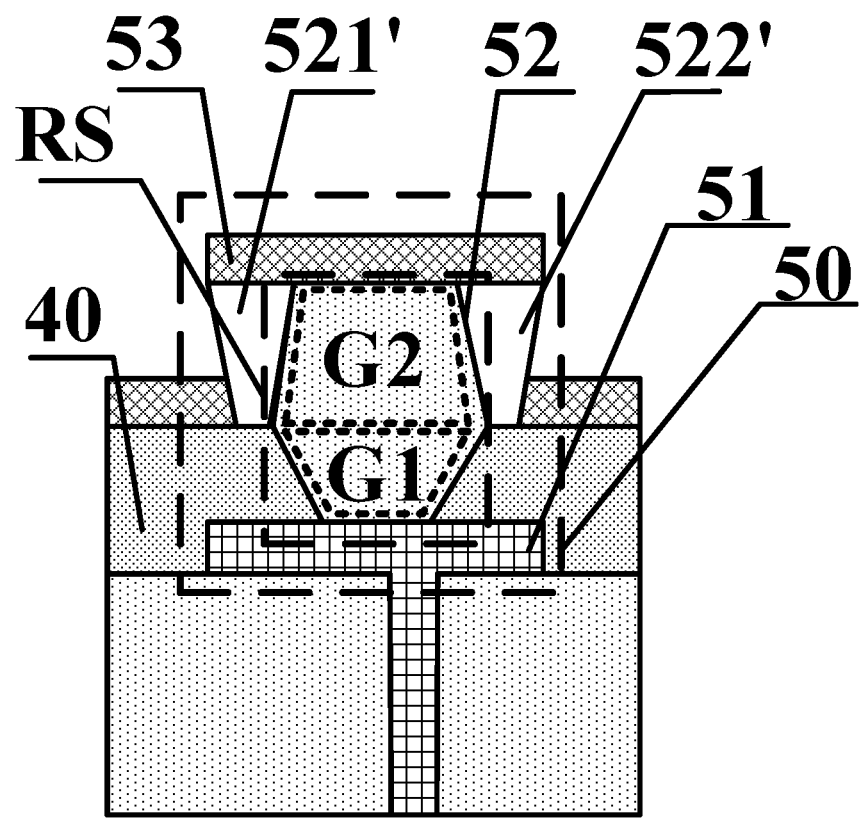
FIG. 6B is a schematic diagram illustrating a structure of a respective one of a plurality of pressure sensors in some embodiments according to the present disclosure.

FIG. 6B is a schematic diagram illustrating a structure of a respective one of a plurality of pressure sensors in some embodiments according to the present disclosure. Referring to FIG. 6B, in some embodiments, the respective one of the plurality of pressure-sensing material blocks 52 is in a receiving space RS defined by the pixel definition layer 40, the respective one of the plurality of first spacer blocks 521', and the respective one of the plurality of second spacer blocks 522'. Optionally, the receiving space RS includes a first groove G1 extending into the pixel definition layer 40 and a second groove G2 rising above the pixel definition layer 10. Optionally, the second groove G2 and the first groove G1 are open to each other. Optionally, the second groove G2 is defined by a pair of the respective one of the plurality of first spacer blocks 521', the respective one of the plurality of second spacer blocks 522', and a respective one of the plurality of second pressure-sensing electrodes 51 Optionally, the respective one of the plurality of pressure-sensing material blocks 52 is electrically connected to respective one of the plurality of first pressure-sensing electrodes 51 through the first groove G1, and is electrically connected to respective one of the plurality of second pressure-sensing electrodes 53 through the second groove G2.

Figure 7:
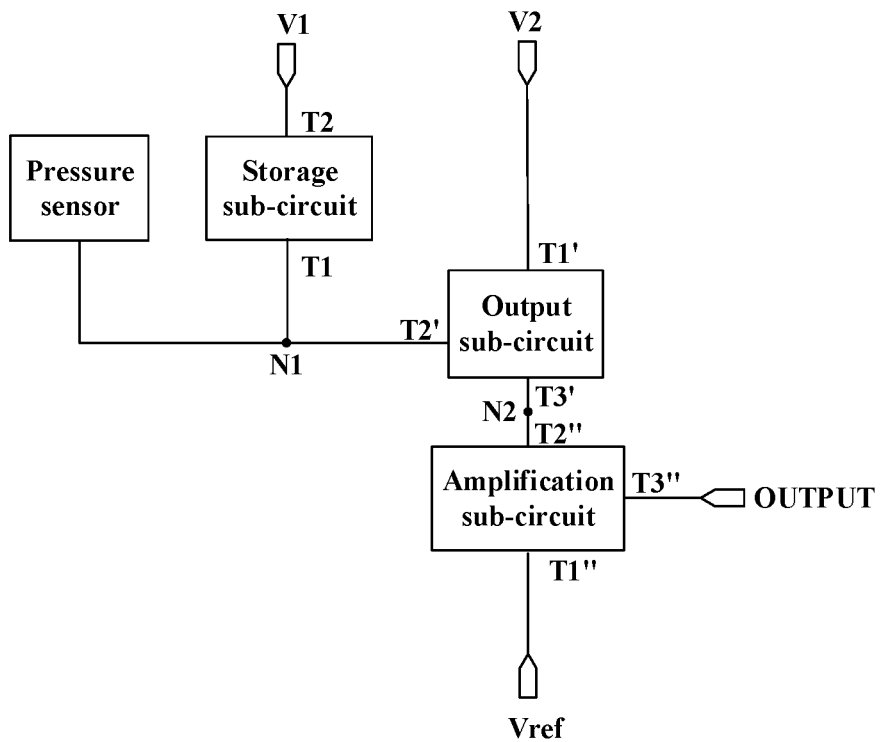
FIG. 7 is a schematic diagram illustrating a structure of a pressure-sensing circuit in some embodiments according to the present disclosure.

FIG. 7 is a schematic diagram illustrating a structure of a pressure-sensing circuit in some embodiments according to the present disclosure. Referring to FIG. 7, in some embodiments, the pressure-sensing circuit includes a storage sub-circuit configured to store a voltage difference between a first node N1 and a first power source V1; an output sub-circuit configured to, under control of the first node N1, amplify a signal from a second power source V2 and output an amplified signal to a second node N2; and an amplification sub-circuit configured to output a second amplified signal to a signal output terminal OUTPUT, based on signals from a reference signal terminal Vref and the second node N2.

Optionally, a first terminal of the storage sub-circuit T1 is connected to the first node N1. A second terminal of the storage sub-circuit T2 is connected to the first power source V1. Optionally, a first terminal of the output sub-circuit T1' is connected to the second power source V2. A second terminal of the output sub-circuit T2' is connected to the first node N1. A third terminal of the output sub-circuit T3' is connected to the second node N2. Optionally, a first terminal of the amplification sub-circuit T1" is connected to the reference signal terminal Verf. A second terminal of the amplification sub-circuit T2" is connected to the second node N2. A third terminal of the amplification sub-circuit T3" is connected to the signal output terminal OUTPUT.

Optionally, the first node N1 is connected to the respective one of the plurality of first pressure-sensing electrodes 51 in FIG. 5. Optionally, the signal output terminal OUTPUT is connected to the chip in FIG. 5.

Optionally, the first power source V1 and the second power source V2 are fixed power sources. Optionally, the first power source V1 and the second power source V2 are configured to provide continuous high level signals.

Optionally, the chip detects a pressure applied on a touch position based on a signal (e.g. the second amplified signal) output from the signal output terminal OUTPUT.

Figure 8:
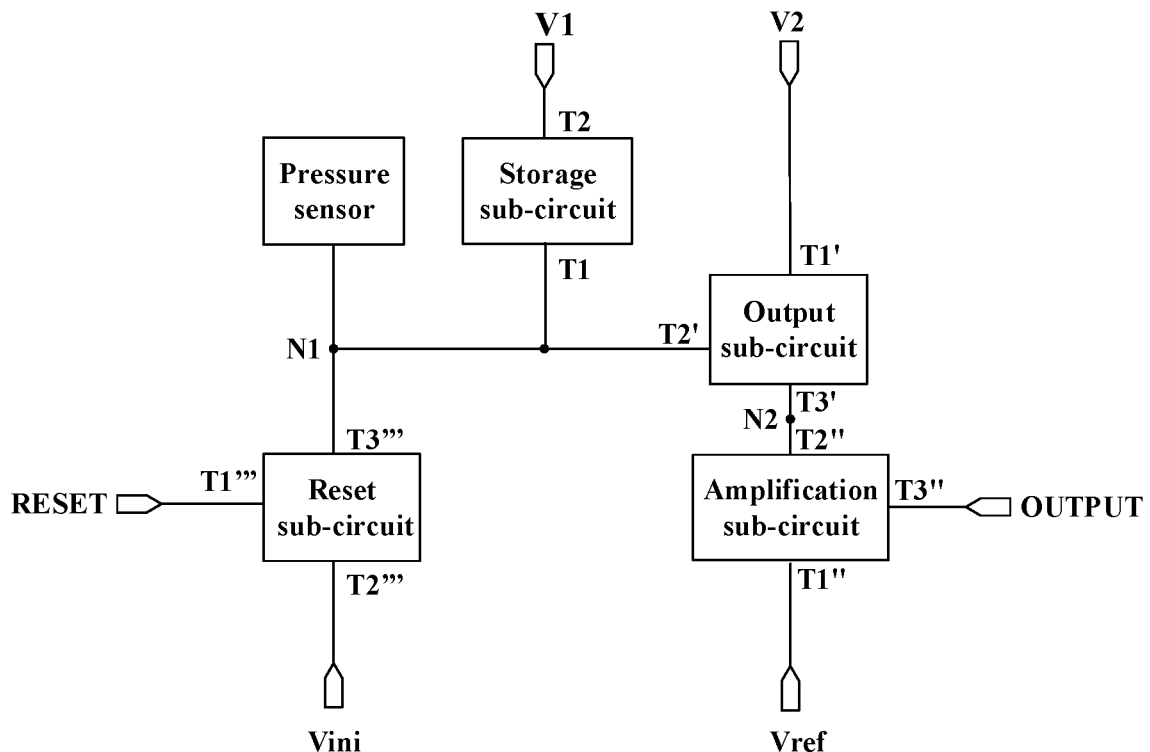
FIG. 8 is a schematic diagram illustrating a structure of a pressure-sensing circuit some embodiments according to the present disclosure.

FIG. 8 is a schematic diagram illustrating a structure of a pressure-sensing circuit in some embodiments according to the present disclosure. Referring to FIG. 8, in some embodiments, in order to accurately detect the pressure applied on the touch position, the pressure-sensing circuit further includes a reset sub-circuit configured to, under control of a reset signal terminal RESET, provide a signal from a signal input terminal Vini to the first node N1.

Optionally, a first terminal of the reset sub-circuit T1''' is connected to the reset signal terminal RESET. A second terminal of the reset sub-circuit T2''' is connected to the signal input terminal Vini. A third terminal of the reset sub-circuit T3''' is connected to the first node N1.

In some embodiments, the reset signal terminal RESET provides a pulse signal. In some embodiments, the signal input terminal Vini provides a pulse signal. Optionally, the signal input terminal Vini provides a continuous level signal.

Figure 9:
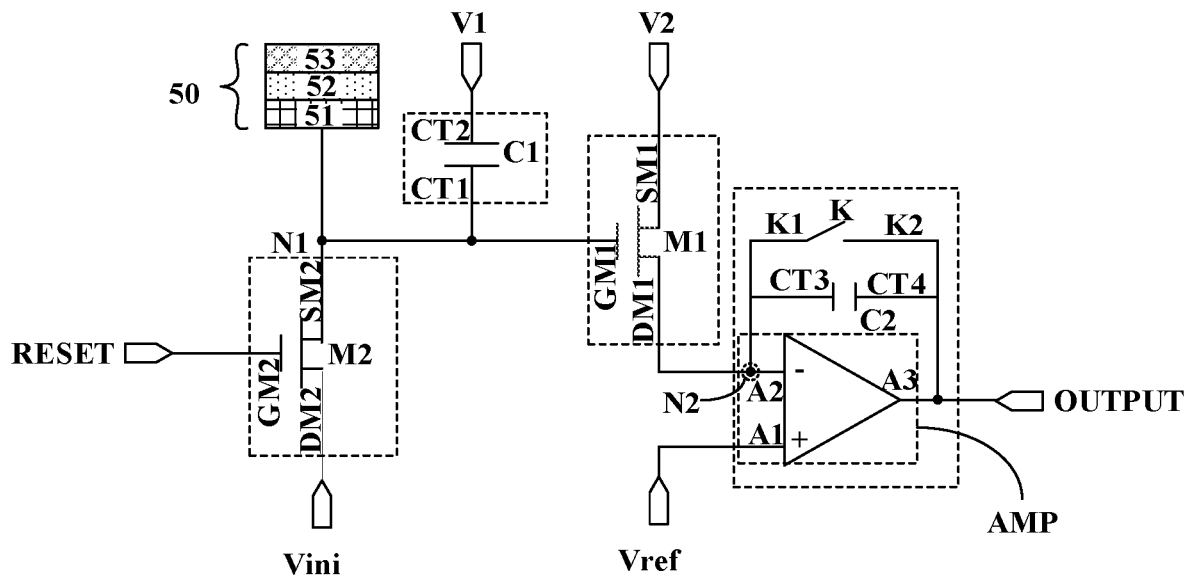
FIG. 9 is a schematic diagram illustrating a structure of a pressure-sensing circuit in some embodiments according to the present disclosure.

FIG. 9 is a schematic diagram illustrating a structure of a pressure-sensing circuit in some embodiments according to the present disclosure. Referring to FIG. 8 and FIG. 9, in some embodiments, the storage sub-circuit further includes a first capacitor C1. Optionally, a first terminal CT1 of the first capacitor C1 is connected to the first node N1, a second terminal CT2 of the first capacitor C1 is connected to the first power source V1. Optionally, the first capacitor C1 is a storage capacitor.

In some embodiments, the output sub-circuit includes a first thin film transistor M1. Optionally, a gate electrode GM1 of the first thin film transistor M1 is connected to the first node N1. A source electrode SM1 of the first thin film transistor M1 is connected to the second power source V2. A drain electrode DM1 of the first thin film transistor M1 is connected to the second node N2.

Optionally, the first thin film transistor M1 is an amplifying thin film transistor. When a signal input in the first thin film transistor M1 is within a linear range, a signal output from the first thin film transistor M1 to the second node N2 increases as the increase of the signal input in the first thin film transistor M1. When the signal input in the first thin film transistor M1 is within a saturation range, the signal output from the first thin film transistor M1 keeps the same, even when the first signal input changes.

Optionally, the first thin film transistor M1 is the respective one of the plurality of sensor thin film transistors 70 in FIG. 6A between the base substrate 10 and the respective one of the plurality of pressure sensors 50.

In some embodiments, amplification sub-circuit includes a switch K, a second capacitor C2, and an amplifier AMP. Optionally, a first input terminal A1 of the amplifier AMP is connected to the reference signal terminal Vref. A second input terminal A2 of the amplifier AMP is connected to the second node N2. An output terminal A3 of the amplifier is connected to the signal output terminal OUTPUT.

Optionally, a first terminal CT3 of the second capacitor C2 is connected to the second node N2. A second terminal CT4 of the second capacitor C2 is connected to the signal output terminal OUTPUT.

Optionally, a first terminal K1 of the switch K is connected to the second node N2. A second terminal K2 of the switch K is connected to the signal output terminal OUTPUT.

In some embodiments, the reset sub-circuit includes a second thin film transistor M2. Optionally, a gate electrode GM2 of the second thin film transistor M2 is connected to the reset signal terminal RESET. A source electrode SM2 of the second thin film transistor M2 is connected to the signal input terminal Vini. A drain electrode DM2 of the second thin film transistor M2 is connected to the first node N1.

Various types of thin film transistors may be used as the first thin film transistor M1 and the second thin film transistor M2. Examples of types of thin film transistors include, but are not limited to, N-type thin film transistors and P-type thin film transistors. Optionally, the process of making the first thin film transistors M1 and the process of making the second thin film transistor M2 can be the same process, which may simply the process of fabricating the pressure-sensing touch control display substrate and lower the cost of fabricating the pressure-sensing touch control display substrate.

Various types of thin film transistors may be used as the first thin film transistor M1 and the second thin film transistor M2. Examples of types of thin film transistors include, but are not limited to amorphous silicon thin film transistors, low temperature polysilicon thin film transistors, oxide thin film transistors, and organic thin film transistors.

Optionally, the first thin film transistor M1 and the second thin film transistor M2 described herein can either be a top gate thin film transistor, or a bottom gate thin film transistor, as long as the thin film transistor has a switch function.

In some embodiment, the first thin film transistor M1 and the second thin film transistor M2 are P-type thin film transistors.

Figure 10:
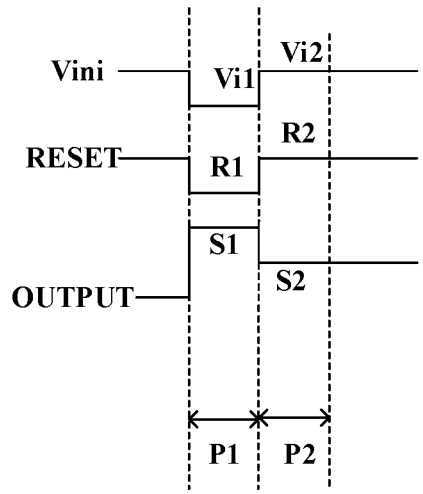
FIG. 10 is a timing diagram of operating a pressure-sensing circuit in some embodiments according to the present disclosure.

FIG. 10 is a timing diagram of operating a pressure-sensing circuit in some embodiments according to the present disclosure. Referring to FIG. 9 and FIG. 10, the pressure-sensing circuit includes two thin film transistors (e.g. the first thin film transistor M1 and the second thin film transistor M2), two capacitors (e.g. the first capacitor C1 and the second capacitor C2), two signal input ends (e.g. the signal input terminal Vini and the reset signal terminal RESET), one signal output terminal OUTPUT, and two power sources (e.g. the first power source V1 and the second power source V2).

Referring to FIG. 8, FIG. 9 and FIG. 10, during the P1 period (e.g. an initialization phase) in FIG. 10, a reset signal R1 input from the reset signal terminal RESET to the gate electrode GM2 of the second thin film transistor M2 is a low level signal. The second thin film transistor M2 is turned on under the low level signal. The second thin film transistor M2 transmits an initial signal input Vi1 from the signal input terminal Vini to the first node N1. The initial signal Vi1 is a low level signal. The first node N1 is initialized and charged with the initial signal Vi1 (e.g. the low level signal), so the first node N1 has a low level signal. Since the first node N1 has the low level signal, the first thin film transistor M1 is turned on under the low level signal. A fixed signal from a second power source V2 is input into the output sub-circuit, and a first amplified signal is output from the output sub-circuit into the amplification sub-circuit. The amplification sub-circuit outputs a first output signal S1 from the signal output terminal OUTPUT and the first output signal S1 is collected by the chip.

During the P2 period (e.g. a pressure-sensing phase) in FIG. 10, when there is a touch applied on the pressure-sensing touch control display substrate, referring to FIG. 6A, the normal distance between the respective one of the plurality of first pressure-sensing electrodes 51 and the respective one of the plurality of second pressure-sensing electrodes 53 is reduced, the center of positive charges and negative charges deviates, resulting in polarization, so, charges appear on a surface of the respective one of the plurality of first pressure-sensing electrodes 51. Because charges appear on the surface of the respective one of the plurality of first pressure-sensing electrodes 51, the electric potential of first node N1 is increased, resulting in a greater current passage in the first thin film transistor M1. For example, the electric potential of first thin film transistor M1 is within the linear range, when the electric potential of first node N1 increases, the electric potential of the gate electrode GM1 of the first thin film transistor M1 increases, a current output from the first thin film transistor M1 also increases. So, a shred of change of the potential of the first node N1 leads to a significant change of the current output from the first film transistor M1.

The fixed signal from the second power source V2 is input into the output sub-circuit, and a second amplified signal is output into the amplification sub-circuit. The amplification sub-circuit output a second output signal S2 from the signal output terminal OUTPUT, and the second output signal S2 is collected by the chip.

The chip detects the pressure of the touch by comparing a difference between the first output signal S1 and the second output signal S2.

In another aspect, the present disclosure provides a pressure-sensing touch control display panel. In some embodiments, the pressure-sensing touch control display panel includes the pressure-sensing touch control display substrate described herein. Optionally, the display panel is an organic light emitting diode display panel.

Optionally, the pressure-sensing touch control display apparatus further includes a counter substrate. Optionally, the pressure-sensing touch control display substrate and the counter substrate are assembled together into a cell, and the pressure-sensing touch control display substrate is encapsulated using the counter substrate.

Optionally, the pressure-sensing touch control display substrate is encapsulated using a counter film.

In another aspect, the present disclosure provides a pressure-sensing touch control display apparatus. In some embodiments, the pressure-sensing touch control display apparatus includes the pressure-sensing touch control display substrate described herein, and one or more integrated circuits connected to the pressure-sensing touch control display substrate.

Optionally, the pressure-sensing touch control display apparatus further includes a counter substrate. Optionally, the pressure-sensing touch control display substrate and the counter substrate are assembled together into a cell, and the pressure-sensing touch control display substrate is encapsulated using the counter substrate.

Optionally, the pressure-sensing touch control display substrate is encapsulated using a counter film.

Examples of appropriate pressure-sensing touch control display apparatuses include, but are not limited to, an electronic paper, a mobile phone, a tablet computer, a television, a monitor, a notebook computer, a digital album, a GPS, etc.

Figure 11:
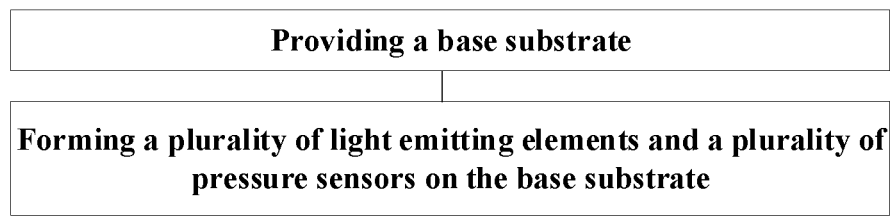
FIG. 11 is a flow chart illustrating a method of fabricating a pressure-sensing touch control display substrate in some embodiments according to the present disclosure.

In another aspect, the present disclosure also provides a method of fabricating a pressure-sensing touch control display apparatus. FIG. 11 is a flow chart illustrating a method of fabricating a pressure-sensing touch control display substrate in some embodiments according to the present disclosure. Referring to FIG. 11, in some embodiments, the method of fabricating the pressure-sensing touch control display apparatus includes providing a base substrate, and forming a plurality of light emitting elements and a plurality of pressure sensor on the base substrate.

In some embodiments, the method of fabricating the pressure-sensing touch control display apparatus includes forming a first electrode layer including a plurality of first electrodes on a base substrate; forming a light emitting layer on a side of the first electrode layer away from the base substrate; forming a second electrode layer on a side of the light emitting layer away from the first electrode layer; forming a plurality of touch control signal lines respectively connected to the plurality of second electrodes; forming a plurality of pressure sensors on the base substrate and configured to detect a pressure applied on a touch position. Optionally, the light emitting layer includes a plurality of light emitting blocks. Optionally, the second electrode layer includes a plurality of second electrodes spaced apart from each other. For example, the plurality of second electrodes are configured to detect a touch position.

Optionally, an orthographic projection of the plurality of pressure sensors on the base substrate is substantially non-overlapping with orthographic projections of the first electrode layer, the light emitting layer, and the second electrode layer on the base substrate.

In some embodiments, the pressure-sensing touch control display substrate is formed to be operated in a time-division driving mode. Optionally, the time-division driving mode includes a display mode and a touch control mode.

In the display mode, a respective one of the plurality of first electrodes, a respective one of the plurality of light emitting blocks, and a respective one of the plurality of second electrodes are parts of (e.g., constitute) a respective one of a plurality of light emitting elements configured to emit light for image display.

In the touch control mode, the plurality of second electrodes are parts of (e.g., constitute) a plurality of touch electrodes. Optionally, the plurality of touch control signal lines are configured to drive touch sensing in the plurality of touch electrodes in the touch control mode.

In some embodiments, the plurality of second electrodes are arranged in array. Optionally, the plurality of second electrodes have a same shape. In the display mode, the plurality of second electrodes are configured to control light emitted from the plurality of light emitting elements. In the touch control mode, the plurality of second electrodes are the plurality of touch electrodes configured to detect the touch position.

Optionally, the plurality of second electrodes are respectively connected to the plurality of touch control signal lines. Optionally, a portion of the edge of a respective one of the plurality of second electrodes are connected to the respective one of the plurality of touch control signal lines.

Optionally, the plurality of second electrodes are self-capacity touch electrodes.

Optionally, the plurality of second electrodes are insulated with each other. For example, two adjacent second electrodes of the plurality of second electrodes are spaced apart by one of the plurality of pressure sensors.

Optionally, the plurality of pressure sensors are configured to detect a level of pressure of a touch position.

In some embodiments, the plurality of light emitting elements can detect a touch position in the touch control mode, the plurality of pressure sensors can detect the press applied on the touch position. The pressure-sensing touch control display substrate having the plurality of light emitting elements 30 and the plurality of pressure sensors can perform a three-dimensional touch control, which may greatly enhance the added value of the product.

In some embodiments, the method of fabricating the pressure-sensing touch control display apparatus further includes a first pressure-sensing electrode layer including a plurality of first pressure-sensing electrodes on the base substrate; a pressure-sensing material layer including a plurality of pressure-sensing material blocks on a side of the first pressure sensing electrode layer away from the base substrate; a second pressure-sensing electrode layer including a plurality of second pressure-sensing electrodes on a side of the pressure-sensing material layer away from the first pressure sensing electrode layer.

Optionally, the pressure-sensing touch control display substrate is formed to include a pixel definition layer defining a plurality of subpixel apertures and defining a plurality of sensor apertures. Optionally, the respective one of the plurality of light emitting blocks is in a respective one of the plurality of subpixel apertures. Optionally, a respective one of the plurality of pressure-sensing material blocks is in a respective one of the plurality of sensor apertures.

Optionally, the method of fabricating the pressure-sensing touch control display apparatus further includes forming a first spacer layer and a second spacer layer on a side of the pixel definition layer away from the base substrate. Optionally, the first spacer layer includes a plurality of first spacer blocks; the second spacer layer include a plurality of second spacer blocks. Optionally, a respective one of the plurality of first spacer blocks is on a first lateral side of the respective one of the plurality of pressure-sensing material blocks; and a respective one of the plurality of second spacer blocks is on a second lateral side of the respective one of the plurality of pressure-sensing material blocks.

In some embodiments, prior to forming the first electrode layer and the first pressure-sensing electrode layer, the method of fabricating the pressure-sensing touch control display apparatus further includes forming a plurality of thin film transistors and a plurality of sensor thin film transistors on the base substrate using a same process. Optionally, the plurality of thin film transistors are formed between the base substrate and the plurality of light emitting elements. Optionally, the plurality of sensor thin film transistors are formed between the base substrate and the plurality of pressure sensors.

Optionally, an orthographic projection of the respective one of the plurality of thin film transistors on the base substrate at least partially overlaps with an orthographic projection of the respective one of the plurality of light emitting elements on the base substrate. Optionally, the orthographic projection of the respective one of the plurality of thin film transistors on the base substrate substantially non-overlaps with an orthographic projection of the respective one of the plurality of pressure sensors on the base substrate.

Optionally, an orthographic projection of the respective one of the plurality of sensor thin film transistors on the base substrate at least partially overlaps with an orthographic projection of the respective one of the plurality of pressure sensors on the base substrate. Optionally, the orthographic projection of the respective one of the plurality of sensor thin film transistors on the base substrate substantially non-overlaps with an orthographic projection of the respective one of the plurality of light emitting elements on the base substrate.

Figure 12A:
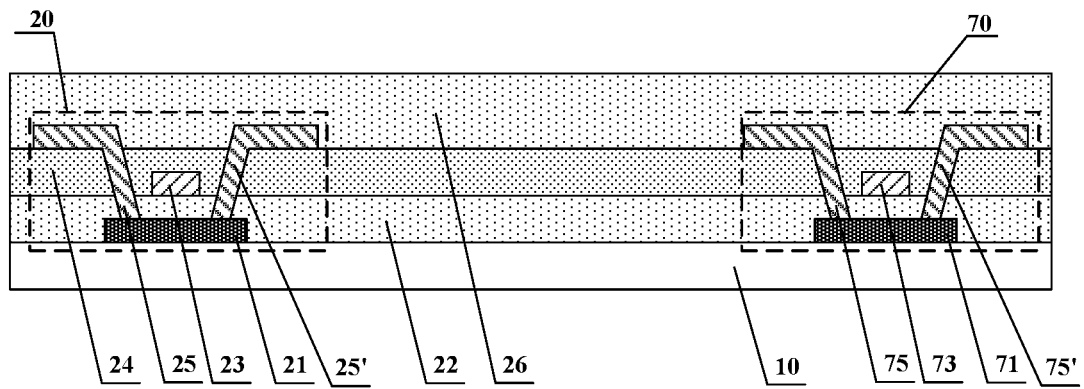
FIG. 12A is a schematic diagram illustrating a structure of a pressure-sensing touch control display substrate in some embodiments according to the present disclosure.

FIGS. 12A-12E is a schematic diagram illustrating a structure of a pressure-sensing touch control display substrate in some embodiments according to the present disclosure. Referring to FIG. 12A, in some embodiments, the method of fabricating the pressure-sensing touch control display apparatus includes forming a plurality of thin film transistors 20 and a plurality of sensor thin film transistors 70 on the base substrate 10.

Optionally, the plurality of thin film transistors 20 and the plurality of sensor thin film transistors 70 are formed using a same process.

Optionally, a respective one of the plurality of thin film transistors 20 is formed to include an active layer 21, a gate insulating layer 22, a gate electrode 23, an inter-layer dielectric layer 24, a source electrode 25, a drain electrode 25', and a planarization layer 26.

Optionally, a he respective one of the plurality of sensor thin film transistors 70 is formed to include a sensor active layer 71, a sensor gate electrode 73, a sensor source electrode 75, a sensor drain electrode 75'. Optionally, the plurality of thin film transistors 20 and the plurality of sensor thin film transistors 70 share the same insulating layer 22, the same inter-layer dielectric layer 24, and the same planarization layer 26.

Figure 12B:
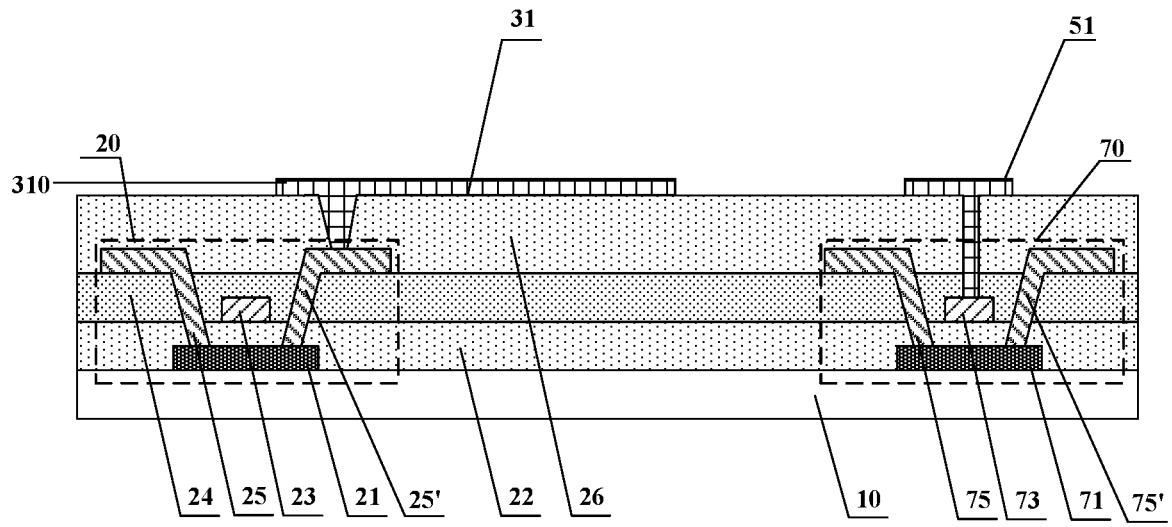
FIG. 12B is a schematic diagram illustrating a structure of a pressure-sensing touch control display substrate in some embodiments according to the present disclosure.

Referring to FIG. 12B, in some embodiments, the method of fabricating the pressure-sensing touch control display apparatus further includes forming a first electrode layer 310 having a plurality of first electrodes 31 on sides of the plurality of thin film transistors 20 away from the base substrate 10, and forming a first pressure-sensing electrode layer 510 having a plurality of first pressure-sensing electrodes 51 on side of the plurality sensor thin film transistors 70 away from the base substrate 10.

Figure 12C:
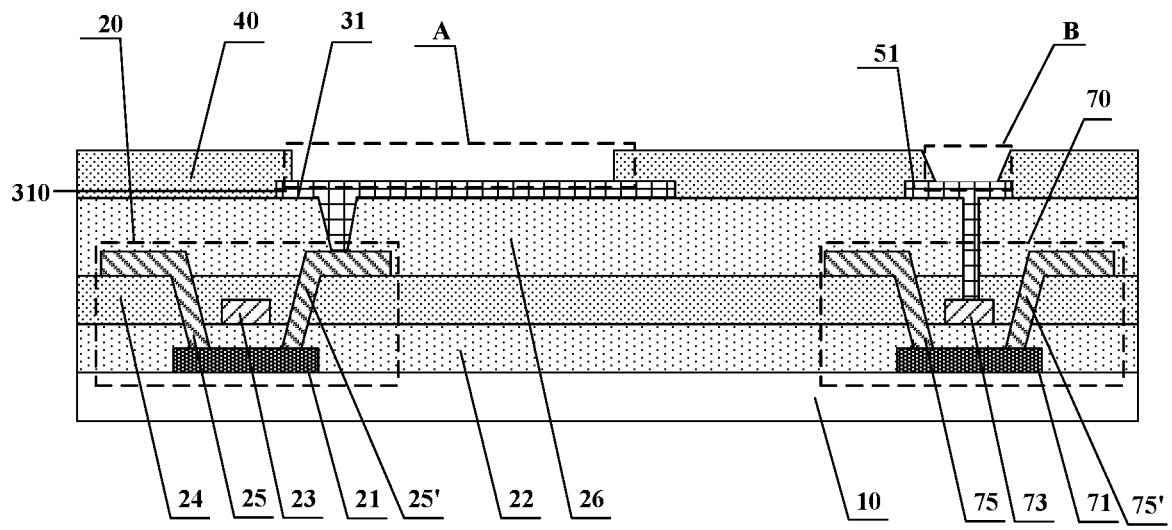
FIG. 12C is a schematic diagram illustrating a structure of a pressure-sensing touch control display substrate in some embodiments according to the present disclosure.

Referring to FIG. 12C, in some embodiments, the method of fabricating the pressure-sensing touch control display apparatus further includes forming a pixel definition layer 40 on a side of the plurality of first pressure-sensing electrodes 51 away from the base substrate 10, forming the pixel definition layer 40 on a side of the plurality of first electrodes 31 away from the base substrate 10.

Optionally, the pixel definition layer 40 is formed to define a plurality of subpixel apertures A and define a plurality of sensor apertures B.

Figure 12D:
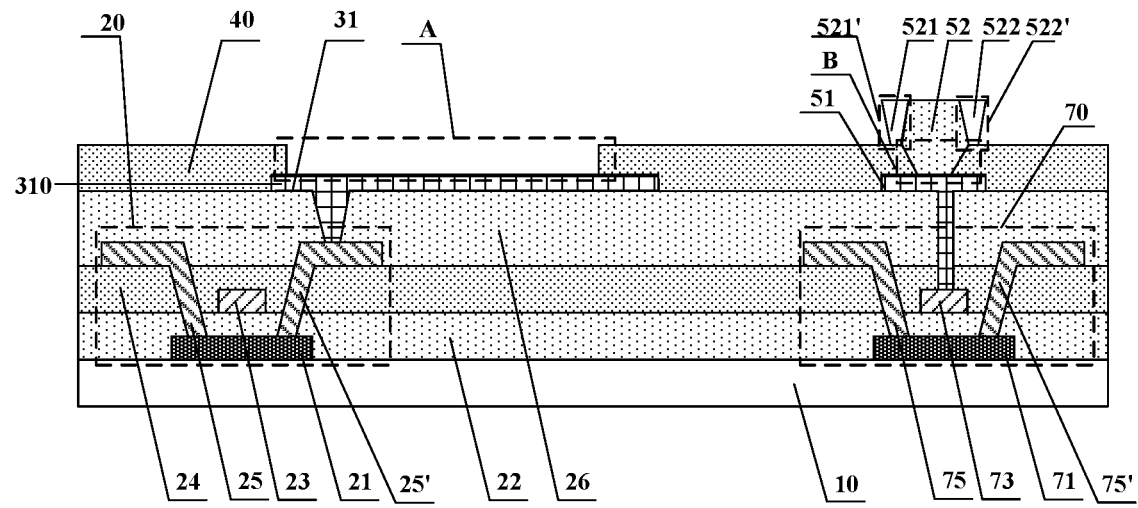
FIG. 12D is a schematic diagram illustrating a structure of a pressure-sensing touch control display substrate in some embodiments according to the present disclosure.

Referring to FIG. 12D, in some embodiments, the method of fabricating the pressure-sensing touch control display apparatus further includes forming a respective one of the plurality of pressure-sensing material blocks 52 is in a respective one of the plurality of sensor apertures B; and forming a respective one of the plurality of first spacer blocks 521' and a respective one of the plurality of second spacer blocks 522' on a side of the pixel definition layer 40 away from the base substrate 10. Optionally, the respective one of the plurality of first spacer blocks 521' is on a first lateral side L1 of the respective one of the plurality of pressure-sensing material blocks 52. Optionally, the respective one of the plurality of second spacer blocks 522' is on a second lateral side L2 of the respective one of the plurality of pressure-sensing material blocks 52.

Various appropriate materials may be used for making the pressure-sensing material layer 520. Examples of materials suitable for making the pressure-sensing material layer 520 include, but are not limited to, piezoelectric materials. Optionally, the piezoelectric materials include, but are not limited to, natural piezoelectric substrates, piezoelectric ceramics, and polymer-film piezoelectrics. Optionally, the natural piezoelectric substrates include, but are not limited to, quartz single crystals. Optionally, the piezoelectric ceramics include, but are not limited to, lithium niobate, gallium arsenide, zinc oxide, aluminium nitride and lead zirconate-titanate (PTZ). Optionally, the polymer-film piezoelectrics include, but are not limited to, polyvinylidene fluoride (PVDF). Additional examples of appropriate piezoelectric materials further include lead zirconium titanate, berlinite, barium titanate, lead titanate, and various substitutes and derivatives thereof (e.g., doped with one or more dopant).

Figure 12E:
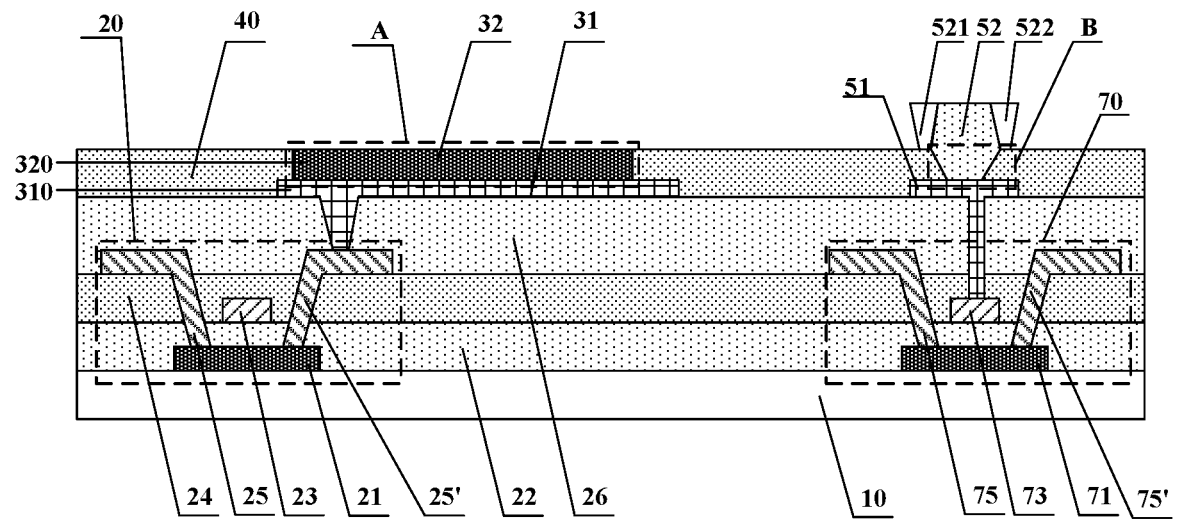
FIG. 12E is a schematic diagram illustrating a structure of a pressure-sensing touch control display substrate in some embodiments according to the present disclosure.

Referring to FIG. 12E, in some embodiments, the method of fabricating the pressure-sensing touch control display apparatus further includes forming a light emitting layer 320 including a plurality of light emitting blocks on a side of the first electrode layer 310 away from the base substrate 10. Optionally, the respective one of the plurality of light emitting blocks 32 is in a respective one of the plurality of subpixel apertures A.

Referring to FIG. 6A, in some embodiments, the method of fabricating the pressure-sensing touch control display apparatus further includes forming a second electrode layer 330 on a side of the light emitting layer 320 away from the first electrode layer 310; and forming a second pressure-sensing electrode layer 530 on a side of the pressure-sensing material layer 520 away from the first pressure-sensing electrode layer 510.

In another aspect, the present disclosure provides a method of driving a pressure-sensing touch control display apparatus. In some embodiments, the method of driving a pressure-sensing touch control display apparatus includes operating the pressure-sensing touch control display substrate in a time-division driving mode. Optionally, the time-division driving mode includes a display mode and a touch control mode.

In some embodiments, the pressure-sensing touch control display apparatus includes a base substrate; a first electrode layer including a plurality of first electrodes; a light emitting layer on a side of the first electrode layer away from the base substrate; a second electrode layer on a side of the light emitting layer away from the first electrode layer; a plurality of touch control signal lines respectively connected to the plurality of second electrodes; and a plurality of pressure sensors on the base substrate and configured to detect a pressure applied on a touch position. Optionally, the light emitting layer includes a plurality of light emitting blocks. Optionally, the second electrode layer includes a plurality of second electrodes spaced apart from each other. Optionally, an orthographic projection of the plurality of pressure sensors on the base substrate is substantially non-overlapping with orthographic projections of the first electrode layer, the light emitting layer, and the second electrode layer on the base substrate.

In the display mode, the method of driving a pressure-sensing touch control display apparatus includes controlling a respective one of the plurality of first electrodes, a respective one of the plurality of light emitting blocks, and a respective one of the plurality of second electrodes to form a respective one of a plurality of light emitting elements to emit light for image display.

In the touch control mode, the method of driving a pressure-sensing touch control display apparatus includes transmitting touch signals through the plurality of touch control signal lines to drive touch sensing in the plurality of touch electrodes to detect a touch position.

Optionally, the method of driving a pressure-sensing touch control display apparatus includes storing a voltage difference between a first node and a first power source in a pressure-sensing circuit; under control of the first node, amplifying a signal from a second power source and outputting an amplified signal to a second node in the pressure-sensing circuit; and outputting a second amplified signal to a signal output terminal, based on signals from a reference signal terminal and the second node. Based on the signal from a second power source and the second amplified signal output from the signal output terminal, the pressure of the touch can be detected.

Optionally, the method of driving a pressure-sensing touch control display apparatus includes, under control of a reset signal terminal, providing a signal from a signal input terminal to the first node.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A pressure-sensing touch control display substrate, comprising:
a base substrate;
a first electrode layer comprising a plurality of first electrodes;
a light emitting layer on a side of the first electrode layer away from the base substrate, the light emitting layer comprising a plurality of light emitting blocks;
a second electrode layer on a side of the light emitting layer away from the first electrode layer, the second electrode layer comprising a plurality of second electrodes spaced apart from each other;
a plurality of touch control signal lines respectively connected to the plurality of second electrodes; and
a plurality of pressure sensors on the base substrate and configured to detect a pressure applied on a touch position;
wherein the pressure-sensing touch control display substrate is operated in a time-division driving mode; the time-division driving mode comprising a display mode and a touch control mode;
a respective one of the plurality of first electrodes, a respective one of the plurality of light emitting blocks, and a respective one of the plurality of second electrodes are parts of a respective one of a plurality of light emitting elements configured to emit light for image display in the display mode;
the plurality of second electrodes are parts of a plurality of touch electrodes in the touch control mode; and
the plurality of touch control signal lines are configured to drive touch sensing in the plurality of touch electrodes in the touch control mode;
wherein a respective one of the plurality of pressure sensors comprises:
a first pressure-sensing electrode layer on the base substrate, and comprising a plurality of first pressure-sensing electrodes;
a pressure-sensing material layer on a side of the first pressure-sensing electrode layer away from the base substrate, and comprising a plurality of pressure-sensing material blocks; and
a second pressure-sensing electrode layer on a side of the pressure-sensing material layer away from the first pressure-sensing electrode layer, and comprising a plurality of second pressure-sensing electrodes;
wherein the pressure-sensing touch control display substrate further comprises:
a pixel definition layer defining a plurality of subpixel apertures and defining a plurality of sensor apertures, the respective one of the plurality of light emitting blocks in a respective one of the plurality of subpixel apertures, a respective one of the plurality of pressure-sensing material blocks in a respective one of the plurality of sensor apertures; and
a first spacer layer and a second spacer layer on a side of the pixel definition layer away from the base substrate;
wherein the first spacer layer comprises a plurality of first spacer blocks;
the second spacer layer comprises a plurality of second spacer blocks;
a respective one of the plurality of first spacer blocks is on a first lateral side of the respective one of the plurality of pressure-sensing material blocks; and
a respective one of the plurality of second spacer blocks is on a second lateral side of the respective one of the plurality of pressure-sensing material blocks;
wherein the respective one of the plurality of pressure-sensing material blocks is in a receiving space defined by the pixel definition layer, the respective one of the plurality of first spacer blocks, and the respective one of the plurality of second spacer blocks;
the receiving space comprises a first groove extending into the pixel definition layer and a second groove rising above the pixel definition layer, the second groove and the first groove open to each other;
the second groove is defined by a pair of the respective one of the plurality of first spacer blocks, the respective one of the plurality of second spacer blocks, and a respective one of the plurality of second pressure-sensing electrodes; and the respective one of the plurality of pressure-sensing material blocks is electrically connected to respective one of the plurality of first pressure-sensing electrodes through the first groove, and is electrically connected to respective one of the plurality of second pressure-sensing electrodes through the second groove.

2. The pressure-sensing touch control display substrate of claim 1, wherein the first pressure-sensing electrode layer and the first electrode layer are in a same layer and comprise a same material.

3. The pressure-sensing touch control display substrate of claim 1, wherein the second pressure-sensing electrode layer and the second electrode layer are in a same layer and comprise a same material.

4. The pressure-sensing touch control display substrate of claim 1, wherein an orthographic projection of a respective one of the plurality of second pressure-sensing electrodes on the base substrate substantially covers an orthographic projection of a respective one of the plurality of first pressure-sensing electrodes on the base substrate.

5. The pressure-sensing touch control display substrate of claim 1, further comprising a plurality of insulating structures on a side of the pixel definition layer away from the base substrate;
wherein a respective one of the plurality of insulating structures spaces apart two adjacent pressure sensors of the plurality of pressure sensors from each other.

6. The pressure-sensing touch control display substrate of claim 1, further comprising a plurality of sensor thin film transistors on the base substrate;
wherein a sensor gate electrode of a respective one of the plurality of sensor thin film transistors is electrically connected to the respective one of the plurality of first pressure-sensing electrodes.

7. The pressure-sensing touch control display substrate of claim 6, wherein an orthographic projection of the respective one of the plurality of sensor thin film transistors on the base substrate at least partially overlaps with an orthographic projection of the respective one of the plurality of pressure sensors on the base substrate.

8. The pressure-sensing touch control display substrate of claim 1, further comprising a plurality of pressure-sensing signal lines, a pressure-sensing circuit, and a chip, the respective one of the plurality of pressure sensors is electrically connected to the chip through the pressure-sensing circuit.

9. The pressure-sensing touch control display substrate of claim 8, wherein the pressure-sensing circuit comprises:
a storage sub-circuit configured to store a voltage difference between a first node and a first power source;
an output sub-circuit configured to, under control of the first node, amplify a signal from a second power source and output an amplified signal to a second node; and
an amplification sub-circuit configured to output a second amplified signal to a signal output terminal, based on signals from a reference signal terminal and the second node;
wherein the first node is connected to the respective one of the plurality of first pressure-sensing electrodes;
a first terminal of the storage sub-circuit is connected to the first node;
a second terminal of the storage sub-circuit is connected to the first power source;
a first terminal of the output sub-circuit is connected to the second power source;
a second terminal of the output sub-circuit is connected to the first node;
a third terminal of the output sub-circuit is connected to the second node;
a first terminal of the amplification sub-circuit is connected to the reference signal terminal;
a second terminal of the amplification sub-circuit is connected to the second node; and
a third terminal of the amplification sub-circuit is connected to the signal output terminal.

10. The pressure-sensing touch control display substrate of claim 9, wherein the storage sub-circuit further comprises a first capacitor;
a first terminal of the first capacitor is connected to the first node;
a second terminal of the first capacitor is connected to the first power source;
wherein the output sub-circuit comprises a first thin film transistor;
a gate electrode of the first thin film transistor is connected to the first node;
a source electrode of the first thin film transistor is connected to the second power source; and
a drain electrode of the first thin film transistor is connected to the second node;
wherein the amplification sub-circuit comprises a switch, a second capacitor, and an amplifier;
a first input terminal of the amplifier is connected to the reference signal terminal;
a second input terminal of the amplifier is connected to the second node;
an output terminal of the amplifier is connected to the signal output terminal;
a first terminal of the second capacitor is connected to the second node; and
a second terminal of the second capacitor is connected to the signal output terminal.

11. The pressure-sensing touch control display substrate of claim 9, further comprising a reset sub-circuit configured to, under control of a reset signal terminal, provide a signal from a signal input terminal to the first node;
wherein a first terminal of the reset sub-circuit is connected to the reset signal terminal;
a second terminal of the reset sub-circuit is connected to the signal input terminal;
a third terminal of the reset sub-circuit is connected to the first node;
the reset sub-circuit comprises a second thin film transistor;
a gate electrode of the second thin film transistor is connected to the reset signal terminal;
a source electrode of the second thin film transistor is connected to the signal input terminal; and
a drain electrode of the second thin film transistor is connected to the first node.

12. The pressure-sensing touch control display substrate of claim 1, wherein the pressure-sensing material layer comprises a piezoelectric material.

13. The pressure-sensing touch control display substrate of claim 1, wherein an orthographic projection of the plurality of pressure sensors on the base substrate is substantially non-overlapping with orthographic projections of the first electrode layer, the light emitting layer, and the second electrode layer on the base substrate.

14. A pressure-sensing touch control display apparatus, comprising the pressure-sensing touch control display substrate of claim 1, and one or more integrated circuits connected to the pressure-sensing touch control display substrate.

15. A method of driving a pressure-sensing touch control display apparatus, comprising operating a pressure-sensing touch control display substrate in a time-division driving mode; the time-division driving mode comprising a display mode and a touch control mode;
wherein the pressure-sensing touch control display apparatus comprises:
a base substrate;
a first electrode layer comprising a plurality of first electrodes;
a light emitting layer on a side of the first electrode layer away from the base substrate, the light emitting layer comprising a plurality of light emitting blocks;
a second electrode layer on a side of the light emitting layer away from the first electrode layer, the second electrode layer comprising a plurality of second electrodes spaced apart from each other;
a plurality of touch control signal lines respectively connected to the plurality of second electrodes; and
a plurality of pressure sensors on the base substrate and configured to detect a pressure applied on a touch position;
wherein a respective one of the plurality of pressure sensors comprises:
a first pressure-sensing electrode layer on the base substrate, and comprising a plurality of first pressure-sensing electrodes;
a pressure-sensing material layer on a side of the first pressure-sensing electrode layer away from the base substrate, and comprising a plurality of pressure-sensing material blocks; and
a second pressure-sensing electrode layer on a side of the pressure-sensing material layer away from the first pressure-sensing electrode layer, and comprising a plurality of second pressure-sensing electrodes;
wherein the pressure-sensing touch control display substrate further comprises:
a pixel definition layer defining a plurality of subpixel apertures and defining a plurality of sensor apertures, the respective one of the plurality of light emitting blocks in a respective one of the plurality of subpixel apertures, a respective one of the plurality of pressure-sensing material blocks in a respective one of the plurality of sensor apertures; and
a first spacer layer and a second spacer layer on a side of the pixel definition layer away from the base substrate;
wherein the first spacer layer comprises a plurality of first spacer blocks;
the second spacer layer comprises a plurality of second spacer blocks;
a respective one of the plurality of first spacer blocks is on a first lateral side of the respective one of the plurality of pressure-sensing material blocks; and
a respective one of the plurality of second spacer blocks is on a second lateral side of the respective one of the plurality of pressure-sensing material blocks;
wherein the respective one of the plurality of pressure-sensing material blocks is in a receiving space defined by the pixel definition layer, the respective one of the plurality of first spacer blocks, and the respective one of the plurality of second spacer blocks;
the receiving space comprises a first groove extending into the pixel definition layer and a second groove rising above the pixel definition layer, the second groove and the first groove open to each other;
the second groove is defined by a pair of the respective one of the plurality of first spacer blocks, the respective one of the plurality of second spacer blocks, and a respective one of the plurality of second pressure-sensing electrodes; and
the respective one of the plurality of pressure-sensing material blocks is electrically connected to respective one of the plurality of first pressure-sensing electrodes through the first groove, and is electrically connected to respective one of the plurality of second pressure-sensing electrodes through the second groove;
wherein an orthographic projection of the plurality of pressure sensors on the base substrate is substantially non-overlapping with orthographic projections of the first electrode layer, the light emitting layer, and the second electrode layer on the base substrate;
wherein, in the display mode, the method comprises controlling a respective one of the plurality of first electrodes, a respective one of the plurality of light emitting blocks, and a respective one of the plurality of second electrodes to form a respective one of a plurality of light emitting elements to emit light for image display;
wherein, in the touch control mode, the method comprises transmitting touch signals through the plurality of touch control signal lines to drive touch sensing in a plurality of touch electrodes to detect a touch position.

16. The method of claim 15, further comprising:
storing a voltage difference between a first node and a first power source in a pressure-sensing circuit;
under control of the first node, amplifying a signal from a second power source and outputting an amplified signal to a second node in the pressure-sensing circuit; and
outputting a second amplified signal to a signal output terminal, based on signals from a reference signal terminal and the second node.

17. The method of claim 16, further comprising, under control of a reset signal terminal, providing a signal from a signal input terminal to the first node.

18. A method of fabricating a pressure-sensing touch control display apparatus, comprising:
forming a first electrode layer comprising a plurality of first electrodes on a base substrate;
forming a light emitting layer on a side of the first electrode layer away from the base substrate, the light emitting layer comprising a plurality of light emitting blocks;
forming a second electrode layer on a side of the light emitting layer away from the first electrode layer, the second electrode layer comprising a plurality of second electrodes spaced apart from each other;
forming a plurality of touch control signal lines respectively connected to the plurality of second electrodes;
forming a plurality of pressure sensors on the base substrate and configured to detect a pressure applied on a touch position;
wherein the pressure-sensing touch control display apparatus is formed to be operated in a time-division driving mode; the time-division driving mode comprising a display mode and a touch control mode;
a respective one of the plurality of first electrodes, a respective one of the plurality of light emitting blocks, and a respective one of the plurality of second electrodes are parts of a respective one of a plurality of light emitting elements configured to emit light for image display in the display mode;
the plurality of second electrodes are parts of a plurality of touch electrodes in the touch control mode;

the plurality of touch control signal lines are configured to drive touch sensing in the plurality of touch electrodes in the touch control mode; and an orthographic projection of the plurality of pressure sensors on the base substrate is substantially non-overlapping with orthographic projections of the first electrode layer, the light emitting layer, and the second electrode layer on the base substrates;

wherein a respective one of the plurality of pressure sensors comprises:

a first pressure-sensing electrode layer on the base substrate, and comprising a plurality of first pressure-sensing electrodes;

a pressure-sensing material layer on a side of the first pressure-sensing electrode layer away from the base substrate, and comprising a plurality of pressure-sensing material blocks; and a second pressure-sensing electrode layer on a side of the pressure-sensing material layer away from the first pressure-sensing electrode layer, and comprising a plurality of second pressure-sensing electrodes;

wherein the method further comprises:

forming a pixel definition layer defining a plurality of subpixel apertures and defining a plurality of sensor apertures, the respective one of the plurality of light emitting blocks in a respective one of the plurality of subpixel apertures, a respective one of the plurality of pressure-sensing material blocks in a respective one of the plurality of sensor apertures; and forming a first spacer layer and a second spacer layer on a side of the pixel definition layer away from the base substrate;

wherein forming the first spacer layer comprises forming a plurality of first spacer blocks;

forming the second spacer layer comprises forming a plurality of second spacer blocks;

a respective one of the plurality of first spacer blocks is formed on a first lateral side of the respective one of the plurality of pressure-sensing material blocks; and a respective one of the plurality of second spacer blocks is formed on a second lateral side of the respective one of the plurality of pressure-sensing material blocks;

wherein the respective one of the plurality of pressure-sensing material blocks is in a receiving space defined by the pixel definition layer, the respective one of the plurality of first spacer blocks, and the respective one of the plurality of second spacer blocks;

the receiving space comprises a first groove extending into the pixel definition layer and a second groove rising above the pixel definition layer, the second groove and the first groove open to each other;

the second groove is defined by a pair of the respective one of the plurality of first spacer blocks, the respective one of the plurality of second spacer blocks, and a respective one of the plurality of second pressure-sensing electrodes; and the respective one of the plurality of pressure-sensing material blocks is electrically connected to respective one of the plurality of first pressure-sensing electrodes through the first groove, and is electrically connected to respective one of the plurality of second pressure-sensing electrodes through the second groove.

* * * * *